(12) United States Patent
Baik

(10) Patent No.: US 11,581,290 B2
(45) Date of Patent: Feb. 14, 2023

(54) SEMICONDUCTOR PACKAGE

(71) Applicant: Samsung Electronics Co., Ltd., Suwon-si (KR)

(72) Inventor: Seunghyun Baik, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/167,538

(22) Filed: Feb. 4, 2021

(65) Prior Publication Data

US 2022/0013500 A1 Jan. 13, 2022

(30) Foreign Application Priority Data

Jul. 13, 2020 (KR) .......................... 10-2020-0086434

(51) Int. Cl.
*H01L 25/065* (2006.01)
*H01L 23/00* (2006.01)
*H01L 23/31* (2006.01)
*H01L 23/528* (2006.01)

(52) U.S. Cl.
CPC ...... *H01L 25/0657* (2013.01); *H01L 23/3185* (2013.01); *H01L 23/528* (2013.01); *H01L 24/29* (2013.01); *H01L 24/45* (2013.01)

(58) Field of Classification Search
CPC ................................................ H01L 25/0657
See application file for complete search history.

(56) References Cited

U.S. PATENT DOCUMENTS

| | | | |
|---|---|---|---|
| 3,581,406 A1 | 11/2013 | Robbins et al. | |
| 3,674,494 A1 | 3/2014 | Nam et al. | |
| 9,041,211 B2 | 5/2015 | Uchiyama | |
| 9,105,754 B2 | 8/2015 | Shishido et al. | |
| 10,153,219 B2 | 12/2018 | Jeon et al. | |
| 10,199,319 B2 | 2/2019 | Shim et al. | |
| 2015/0235994 A1* | 8/2015 | Ohba | H01L 24/97 257/676 |
| 2019/0164888 A1 | 5/2019 | Chien et al. | |
| 2019/0279925 A1* | 9/2019 | Hsu | H01L 25/0657 |
| 2020/0144234 A1 | 5/2020 | Jeon et al. | |

FOREIGN PATENT DOCUMENTS

JP 2011233915 A 11/2011

OTHER PUBLICATIONS

Samsung, Internet Technology Notice No. KR 2013-180, issued Nov. 19, 2013.

* cited by examiner

*Primary Examiner* — Yu-Hsi D Sun
(74) *Attorney, Agent, or Firm* — Muir Patent Law, PLLC

(57) ABSTRACT

A semiconductor package includes a package substrate including an insulating layer having an upper surface and a lower surface and provided with a first region which is recessed to a first depth from the upper surface toward the lower surface, a redistribution wiring buried in the insulating layer, a chip connection pad on a bottom surface of the recessed first region and connected to the redistribution wiring, and a wire connection pad on the upper surface of the insulating layer and connected to the redistribution wiring, a first semiconductor chip overlapping, in a top-down view of the semiconductor package, the recessed first region of the insulating layer and comprising a first chip pad connected to the chip connection pad of the package substrate, and a second semiconductor chip on the first semiconductor chip and connected to the wire connection pad of the package substrate through a conductive wire.

16 Claims, 13 Drawing Sheets

SEMICONDUCTOR PACKAGE

CROSS-REFERENCE TO RELATED APPLICATION

This application claims priority under 35 U.S.C. § 119 to Korean Patent Application No. 10-2020-0086434, filed on Jul. 13, 2020, in the Korean Intellectual Property Office, the disclosure of which is incorporated by reference herein in its entirety.

BACKGROUND

The inventive concept relates to a semiconductor package, and more particularly to, a semiconductor package including a plurality of semiconductor chips.

As the storage capacity of semiconductor packages increases, a semiconductor package including a semiconductor chip is desirable to be thin and lightweight. Research is being conducted to include semiconductor chips that have various functions in a semiconductor package so that the semiconductor chips operate in high speed.

Accordingly, a semiconductor package may include a package substrate and a plurality of semiconductor chips stacked on the package substrate. For example, the plurality of semiconductor chips may be electrically connected to the package substrate through wire bonding, flip chip bonding, etc.

SUMMARY

The inventive concept provides a semiconductor package of a reduced size.

The inventive concept also provides a semiconductor package with improved structural reliability.

According to an embodiment of the present inventive concept, a semiconductor package includes a package substrate including an insulating layer having an upper surface and a lower surface opposite to the upper surface and provided with a first region which is recessed to a first depth from the upper surface toward the lower surface, a redistribution wiring buried in the insulating layer, a chip connection pad on a bottom surface of the recessed first region and connected to the redistribution wiring, and a wire connection pad on the upper surface of the insulating layer and connected to the redistribution wiring, a first semiconductor chip overlapping, in a top-down view of the semiconductor package, the recessed first region of the insulating layer and comprising a first chip pad connected to the chip connection pad of the package substrate, and a second semiconductor chip on the first semiconductor chip and connected to the wire connection pad of the package substrate through a conductive wire.

According to an embodiment of the present inventive concept, a semiconductor package includes a package substrate including an insulating layer having an upper surface and a lower surface opposite to the upper surface, and provided with a first region which is recessed to a first depth from the upper surface toward the lower surface, a redistribution wiring buried in the insulating layer, a chip connection pad on a bottom surface of the recessed first region and connected to the redistribution wiring, and a wire connection pad on the upper surface of the insulating layer and connected to the redistribution wiring, a first semiconductor chip overlapping, in a top-down view of the semiconductor package, the recessed first region of the insulating layer, the first semiconductor chip including a first semiconductor substrate which has a lower surface and an upper surface opposite to each other, the lower surface of the first semiconductor substrate being closer to the bottom surface of the recessed first region of the package substrate than the upper surface of the first semiconductor substrate, and a first chip pad which is disposed on the lower surface of the first semiconductor substrate and is connected to a first active layer which corresponds to a portion of the first semiconductor substrate, the portion of the first semiconductor substrate being adjacent to the upper surface of the first semiconductor substrate, a chip connection terminal in the recessed first region of the insulating layer and interposed between the chip connection pad of the package substrate and the first chip pad of the first semiconductor chip, a first adhesion layer on the package substrate and surrounding the first semiconductor chip, a second semiconductor chip on the first adhesion layer, the second semiconductor chip including a second semiconductor substrate having a lower surface and an upper surface opposite to each other, the lower surface of the second semiconductor substrate being closer to the upper surface of the first semiconductor substrate than the upper surface of the second semiconductor substrate, and a second chip pad disposed on the upper surface of the second semiconductor substrate and connected to a second active layer which corresponds a portion of the second semiconductor substrate, the portion of the second semiconductor substrate being adjacent to the upper surface of the second semiconductor substrate, a conductive wire connecting the wire connection pad of the package substrate to the second chip pad of the second semiconductor chip, and a first molding layer on the package substrate and surrounding the first adhesion layer and the second semiconductor chip.

According to an embodiment of the present inventive concept, a semiconductor package includes a package substrate including an insulating layer having an upper surface and a lower surface opposite to the upper surface and provided with a first region which is recessed to a first depth from the upper surface toward the lower surface, a redistribution wiring buried in the insulating layer, a chip connection pad on a bottom surface of the recessed first region and connected to the redistribution wiring, and a wire connection pad on the upper surface and connected to the redistribution wiring, a first semiconductor chip overlapping, in a top-down view of the semiconductor package, the recessed first region of the insulating layer, the first semiconductor chip being provided with a first active layer in a lower portion of the first semiconductor chip, and flip-chip bonded to the chip connection pad of the package substrate, a first adhesion layer on the package substrate and surrounding the first semiconductor chip, a second semiconductor chip on the first adhesion layer, the second semiconductor chip being provided with a second active layer in an upper portion of the second semiconductor chip, and wire-bonded to the wire connection pad of the package substrate, a third semiconductor chip on the second semiconductor chip, the third semiconductor chip being provided with a third active layer in an upper portion of the third semiconductor chip, and wire-bonded to the wire connection pad of the package substrate, and a first molding layer on the package substrate, and surrounding the first adhesion layer, the second semiconductor chip, and the third semiconductor chip.

A semiconductor package according to the inventive concept may include a package substrate having a recessed region and a semiconductor chip positioned in the recessed region. Accordingly, the height of the semiconductor package may be reduced so that the semiconductor package may be thinner.

Further, according to the inventive concept, the height of the semiconductor chip formed in the vertical direction from one surface of the package substrate may be reduced by the depth of the recessed region of the package substrate. Accordingly, adhesion performance between the semiconductor chip and an adhesion layer surrounding the semiconductor chip may be improved, and structural reliability of the semiconductor package including the semiconductor chip and the adhesion layer may be improved.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
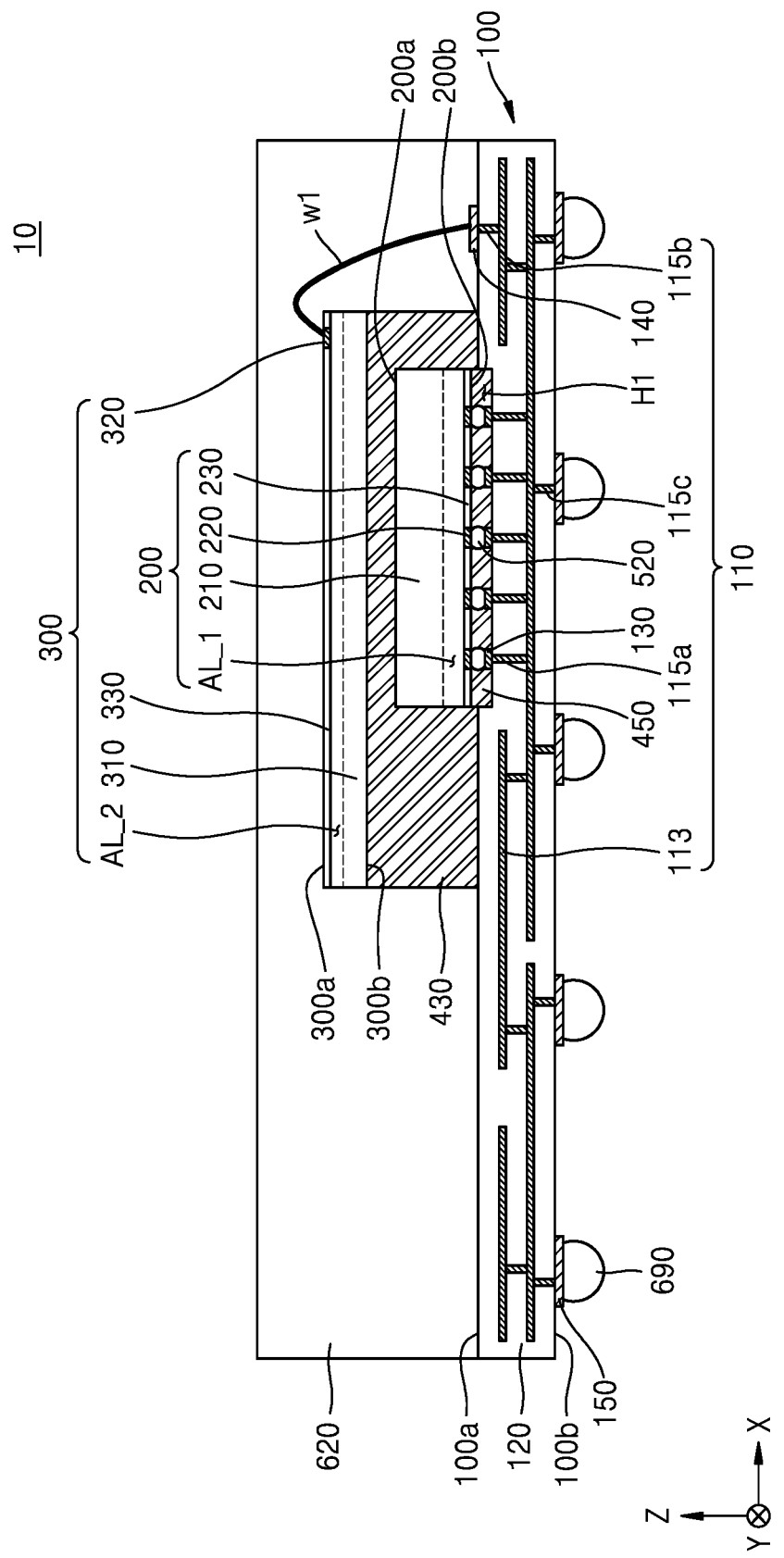
FIG. 1 is a cross-sectional view of a semiconductor package according to an embodiment of the inventive concept.

FIG. 1 is a cross-sectional view of a semiconductor package 10 according to an embodiment of the inventive concept.

The semiconductor package 10 according to the embodiment of the inventive concept may include a package substrate 100, a first semiconductor chip 200, a second semiconductor chip 300, a first adhesion layer 430, and a second adhesion layer 450, a chip connection terminal 520, a first conductive wire w1, a molding layer 620, an external connection terminal 690, and the like.

The semiconductor package 10 of the inventive concept may include a plurality of semiconductor chips 200 and 300 and may be a system in package (SIP) operating as one system in which the plurality of semiconductor chips 200 and 300 of different types are electrically connected to each other.

The package substrate 100 may be a substrate for mounting the first semiconductor chip 200 and the second semiconductor chip 300. In an embodiment, the package substrate 100 may be a printed circuit board (PCB). However, the package substrate 100 is not limited to the above and may be a substrate including a redistribution layer, which including a redistribution wiring, sliced from a wafer.

The package substrate 100 may have a first surface 100a and a second surface 100b facing the first surface 100a. For example, the first surface 100a of the package substrate 100 may be an upper surface of the package substrate 100, and the second surface 100b may be a lower surface of the package substrate 100. In an embodiment, a surface of the package substrate 100 on which the external connection terminal 690 is formed is described as the lower surface of the package substrate 100, and the opposite side on which the molding layer 620 is formed is described as the upper surface of the package substrate 100.

In an embodiment, the package substrate 100 may include a recessed region H1 which is adjacent to the first surface 100a. The recessed region H1 may correspond to a portion of the package substrate 100 which is recessed to a first depth from the first surface 100a toward the second surface 100b. The package substrate 100 may include the recessed region H1 of a concave shape (e.g., a groove or a trench) in the upper portion of the package substrate 100. The recessed region H1 of the package substrate 100 may provide a space in which the first semiconductor chip 200 is disposed.

In an embodiment, the package substrate 100 may include a redistribution pattern 110 (i.e., a redistribution wiring), an insulating layer 120, a chip connection pad 130, a wire connection pad 140, an external connection pad 150, and the like. The various pads of a device or a package substrate described herein may be conductive terminals connected to internal wiring of the device or the package substrate, and may transmit signals and/or supply voltages between an internal wiring and/or internal circuit of the device and an external source. For example, chip pads of a semiconductor chip may electrically connect to and transmit supply voltages and/or signals between an integrated circuit of the semiconductor chip and a device to which the semiconductor chip is connected, or pads of a package substrate may electrically connect to and transmit supply voltages and/or signals between internal wirings of the package substrate and a device to which the package substrate is connected. The various pads may be provided on or near an external surface of the device and may generally have a planar surface area (often larger than a corresponding surface area of the internal wiring to which they are connected) to promote connection to a further terminal, such as a bump or solder ball, and/or an external wiring.

The insulating layer 120 of the package substrate 100 may be a layer which may include or may be formed of an insulating material forming the exterior of the package substrate 100. The insulating layer 120 may surround the redistribution pattern 110. In an embodiment, the redistribution pattern 110 may be buried in the insulating layer 120. In an embodiment, the insulating layer 120 may include an upper surface which corresponds to the first surface 100a of the package substrate 100, and a lower surface which corresponds to the second surface 100b of the package substrate 100. The insulating layer 120 may be provided with the recessed region H1 at the top of the insulating layer 120, and the chip connection pad 130 of the package substrate 100 may be on a bottom surface of the recessed region H1. In an embodiment, the recessed region of the insulating layer 120 may correspond to a region of the insulating layer 120 which is recessed to a first depth from the upper surface of the insulating layer 120 toward the lower surface of the insulating layer 120.

In an embodiment, the first depth of the recessed region H1 of the insulating layer 120 (i.e., the depth of the recessed region H1 of the insulating layer 120 in the Z direction) may have a value from about 1 micrometer to about 20 micrometers. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

For example, when the depth of the recessed region H1 of the insulating layer 120 is less than 1 micrometer, the recessed region H1 may hardly reduce the size of the semiconductor package 10 (i.e., the thickness of the semiconductor package 10). When the depth of the recessed region H1 of the insulating layer 120 is greater than 20 micrometers, the recessed region H1 may reduce the structural reliability of the package substrate 100.

In an embodiment, a side surface of the recessed region H1 of the insulating layer 120 may surround at least a part of a second adhesion layer 450 that will be described later.

In an embodiment, the insulating layer 120 may include oxide or nitride. For example, the insulating layer 120 may include silicon oxide or silicon nitride.

However, the insulating layer 120 is not limited to the above, and may include or may be formed of a photo imagable dielectric (PID) insulating material capable of a photolithography process. For example, the insulating layer 120 may include or may be formed of at least one of photosensitive polyimide (PSPI) and polybenzobisoxazole (PBO).

The redistribution pattern 110 of the package substrate 100 may be a conductive pattern in the insulating layer 120 and electrically connected to the chip connection pad 130, the wire connection pad 140, and the external connection pad 150.

In an embodiment, the redistribution pattern 110 may include a redistribution line pattern 113 extending in the horizontal direction within the insulating layer 120, a first redistribution via pattern 115a extending in the vertical direction within the insulating layer 120 and connecting the redistribution line pattern 113 to the chip connection pad 130, a second redistribution via pattern 115b extending in the vertical direction within the insulating layer 120 and connecting the redistribution line pattern 113 to the wire connection pad 140, and a third redistribution via pattern 115c extending in the vertical direction within the insulating layer 120 and connecting the redistribution line pattern 113 to the external connection pad 150.

In an embodiment, the redistribution pattern 110 may be a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), etc., or an alloy thereof, but is not limited to these.

In an embodiment, the redistribution pattern 110 may further include a seed layer (not shown) interposed between the redistribution line pattern 113 and the insulating layer 120, and interposed between the insulating layer 120 and each of the first to third redistribution via patterns 115a, 115b, and 115c.

In an embodiment, the seed layer may be formed through a physical vapor deposition process, and the redistribution line pattern 113 and the first to third redistribution via patterns 115a, 115b, and 115c may be formed through a plating process using the seed layer.

In an embodiment, the seed layer may include or may be formed of copper (Cu), titanium (Ti), titanium tungsten (TiW), titanium nitride (TiN), tantalum (Ta), tantalum nitride (TaN), chromium (Cr), aluminum (Al), or a combination thereof. For example, the seed layer may be a double layer of Cu/Ti in which a copper layer is stacked on a titanium layer or a double layer of Cu/TiW in which a copper layer is stacked on an alloy layer of titanium and tungsten.

For example, when copper (Cu) is used as the material of the redistribution line pattern 113 and the first to third redistribution via patterns 115a, 115b, 115c, at least a part of the seed layer may serve as a diffusion barrier layer.

The chip connection pad 130 of the package substrate 100 may be a pad which is disposed in the recessed region H1 of the package substrate 100 and electrically connects the first semiconductor chip 200 to the redistribution pattern 110. In an embodiment, the chip connection pad 130 may be on the bottom surface of the recessed region H1.

In an embodiment, the chip connection pad 130 may be electrically connected to the redistribution line pattern 113 through the first redistribution via pattern 115a. The upper surface of the chip connection pad 130 is not covered by the insulating layer 120 and may contact the chip connection terminal 520. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

A level of the upper surface of the chip connection pad 130 may be defined as a height at which the upper surface of the chip connection pad 130 is formed in the vertical direction (i.e., the Z direction) from the second surface 100b of the package substrate 100. In an embodiment, the level of the upper surface of the chip connection pad 130 may be lower than the level of the upper surface of the wire connection pad 140.

The wire connection pad 140 of the package substrate 100 may be a pad which is disposed on the first surface 100a of the package substrate 100 and electrically connects the second semiconductor chip 300 to the redistribution pattern 110.

In an embodiment, the wire connection pad 140 may be electrically connected to the redistribution line pattern 113 through the second redistribution via pattern 115b. The upper surface of the wire connection pad 140 is not covered by the insulating layer 120 and may contact the first conductive wire w1.

The wire connection pad 140 may be outside the recessed region H1 of the package substrate 100. Accordingly, the wire connection pad 140 may be outside the chip connection pad 130. The level of the upper surface of the wire connection pad 140 may be higher than the level of the upper surface of the chip connection pad 130.

The external connection pad 150 of the package substrate 100 may be a pad which is disposed on the second surface 100b of the package substrate 100 and electrically connects the redistribution pattern 110 to an external device.

In an embodiment, the external connection pad 150 may be electrically connected to the redistribution line pattern 113 through the third redistribution via pattern 115c. The lower surface of the external connection pad 150 is not covered by the insulating layer 120 and may contact the external connection terminal 160.

The first semiconductor chip 200 may be a semiconductor chip on the recessed region H1 of the package substrate 100 and connected to the package substrate 100 through flip-chip bonding. The first semiconductor chip 200 may have an upper surface 200a and a lower surface 200b. The first semiconductor chip 200 may be provided with an active layer having a plurality of transistors which is adjacent to the lower surface 200b, and chip pads on the lower surface 200b. The chip pads may be electrically connected to the transistors formed in the active layer of the first semiconductor chip 200. In the flip-chip bonding, the lower surface 200b of the first semiconductor chip 200 may be attached to the package substrate 100 using the chip pads. For example, the chip pads on the lower surface 200b of the first semiconductor chip 200 may be connected in the flip-chip bonding to the chip connection pad 130 which is disposed on the bottom surface of the recess region H1.

In an embodiment, the lower surface 200b of the first semiconductor chip 200 may be at a higher level than the first surface 100a of the package substrate 100. The lower surface 200b of the first semiconductor chip 200 may be spaced apart from the first surface 100a of the package substrate 100 in the vertical direction.

However, the lower surface 200b of the first semiconductor chip 200 is not limited to the above, and may be at a lower level than the first surface 100a of the package substrate 100. At least a part of the first semiconductor chip 200 may be accommodated in the recessed region H1 of the package substrate 100.

In an embodiment, the first semiconductor chip 200 may include a logic semiconductor chip. The logic semiconductor chip may include, for example, a logic semiconductor chip such as a central processor unit (CPU), a microprocessor unit (MPU), a graphic processor unit (GPU), or an application processor (AP).

The first semiconductor chip 200 may include a memory semiconductor chip. The memory semiconductor chip may include, for example, a volatile memory semiconductor chip such as dynamic random access memory (DRAM) or static random access memory (SRAM), and may include a non-volatile memory semiconductor chip such as a phase-change random access memory (PRAM), magneto-resistive Random access memory (MRAM), ferroelectric random access memory (FeRAM), or resistive random access memory (RRAM).

In an embodiment, the first semiconductor chip 200 may include a first semiconductor substrate 210, a first chip pad 220, and a first passivation layer 230. The first semiconductor substrate 210 may have a first active layer AL_1 which is adjacent to the lower surface 200b of the first semiconductor chip 200. The first active layer AL_1 of the first semiconductor chip 200 may face the package substrate 100. In an embodiment, the first active layer AL_1 may include various types of a plurality of individual devices. For example, the plurality of individual devices may include various microelectronic devices, for example, a complementary metal-oxide semiconductor (CMOS) transistor, a metal-oxide-semiconductor filed effect transistor (MOSFET), and a system large scale integration (LSI), an image sensor such as a CMOS imaging sensor (CIS), a micro-electro-mechanical system (MEMS), an active device, a passive device, etc.

In an embodiment, the material of the first semiconductor substrate 210 may include silicon (Si). The first semiconductor substrate 210 may include or may be formed of a semiconductor element such as germanium (Ge, germanium), or a compound such as silicon carbide (SiC), gallium arsenide (GaAs), indium arsenide (InAs), and indium phosphide (InP). However, the material of the first semiconductor substrate 210 is not limited to the above.

In an embodiment, the first chip pad 220 may be a pad which is disposed on the first semiconductor substrate 210 and is electrically connected to the plurality of individual devices formed in the first active layer AL_1.

In an embodiment, the material of the first chip pad 220 may include or may be formed of metal such as nickel (Ni), copper (Cu), gold (Au), silver (Ag), aluminum (Al), tungsten (W), titanium (Ti), Tantalum (Ta), indium (In), molybdenum (Mo), manganese (Mn), cobalt (Co), tin (Sn), magnesium (Mg), rhenium (Re), beryllium (Be), gallium (Ga), Ruthenium (Ru), or the like, or an alloy thereof. However, the material of the first chip pad 220 is not limited to the above.

In an embodiment, the first passivation layer 230 may be on the first semiconductor substrate 210 and may surround a side surface of the first chip pad 220. The first passivation layer 230 may expose one surface of the first chip pad 220. In an embodiment, the first passivation layer 230 may include or may be formed of an insulating material such as an insulating polymer.

In an embodiment, the first active layer AL_1 of the first semiconductor chip 200 may face the package substrate 100, and the first semiconductor chip 200 may be connected to the package substrate 100 through flip-chip bonding.

In an embodiment, the chip connection terminal 520 may be interposed between the first chip pad 220 of the first semiconductor chip 200 and the chip connection pad 130 of the package substrate 100. The chip connection terminal 520 may electrically connect the first chip pad 220 and the chip connection pad 130. For example, the chip connection terminal 520 may be a metal material including at least one of silver (Ag), copper (Cu), and aluminum (Al). In an embodiment, the chip connection terminal 520 may be formed of a ball shape.

In an embodiment, the first semiconductor chip 200 may be connected to the chip connection pad 130 on the bottom surface of the recessed region H1 of the package substrate 100, and thus the level of the upper surface 200a of the first semiconductor chip 200 may be lowered. The recessed region H1 of the package substrate 100 may reduce the height of the upper surface 200a of the first semiconductor chip 200 forming in the vertical direction (i.e., in the Z direction) from the second surface 100b of the package substrate 100.

The first adhesion layer 430 may be a layer surrounding the first semiconductor chip 200 on the package substrate 100. For example, the first adhesion layer 430 may surround side and upper surfaces of the first semiconductor chip 200 on the package substrate 100.

In an embodiment, the first adhesion layer 430 may serve to attach the second semiconductor chip 300 on the first semiconductor chip 200. The first adhesion layer 430 may be a film having self-adhesive properties. For example, the first adhesion layer 430 may be a double-sided adhesion film.

In an embodiment, the first adhesion layer 430 may be a tape-type material layer, a liquid-coated curing material layer, or a combination thereof. The first adhesion layer 430 may include or may be formed of a thermal setting structure, thermal plastic, a UV (ultraviolet) cure material, or a combination thereof. The first adhesion layer 430 may be referred to as a die attach film (DAF) or a non-conductive film (NCF).

In an embodiment, the thickness of the first adhesion layer 430 may be greater than the thickness of the first semiconductor chip 200. A level of the upper surface of the first adhesion layer 430 may be higher than a level of the upper surface 200a of the first semiconductor chip 200.

In an embodiment, the thickness of the first adhesion layer 430 may have a value from about 90 micrometers to about 135 micrometers. For example, the thickness of the first adhesion layer 430 may be 110 micrometers.

For example, when the thickness of the first adhesion layer 430 is less than 90 micrometers, adhesion between the first adhesion layer 430 and the first semiconductor chip 200 may deteriorate. When the thickness of the first adhesion layer 430 is greater than 135 micrometers, the size (e.g., the thickness) of the semiconductor package 10 including the first semiconductor chip 200 and the second semiconductor chip 300 may increase.

In an embodiment, the first adhesion layer 430 may be pressed onto the package substrate 100 while attached to the lower surface 300b of the second semiconductor chip 300. The first adhesion layer 430 may include a material having fluidity such that the first adhesion layer 430 may surround the side and upper surfaces of the first semiconductor chip 200 while pressed onto the package substrate 100.

A side surface of the first adhesion layer 430 and a side surface of the second semiconductor chip 300 may be coplanar with each other. The side surface of the first adhesion layer 430 may be aligned with (i.e., may be coplanar to) the side surface of the second semiconductor chip 300.

In an embodiment, the first adhesion layer 430 and the second semiconductor chip 300 may be manufactured at a wafer level. After the first adhesion layer 430 is applied on the wafer on which the plurality of second semiconductor chips 300 are formed, the wafer may be individualized, and thus the side surface of the first adhesion layer 430 and the side surface of the second semiconductor chip 300 may be coplanar with each other.

When a semiconductor package according to the comparative example includes a general PCB having no recessed region, the height of the semiconductor chip mounted on the package substrate formed in the vertical direction from one surface of the package substrate may be greater than the height of the first semiconductor chip 200 of the semiconductor package 10 according to the inventive concept forming in the vertical direction from one surface of the package substrate 100.

In the case of the semiconductor package according to the comparative example, adhesion between the semiconductor chip and the adhesion layer surrounding the side and upper surfaces of the semiconductor chip may be weakened due to a relatively large height of the semiconductor chip in the vertical direction. For example, separation of the semiconductor chip from the adhesion layer may occur.

In the case of the semiconductor package 10 according to an embodiment of the inventive concept, the length (i.e., the height) of the first semiconductor chip 200 formed in the vertical direction from the second surface 100b of the package substrate 100 may be reduced by the depth of the recessed region H1 of the package substrate 100, and thus the adhesion between the first semiconductor chip 200 and the first adhesion layer 430 may be improved. For example, separation of the first semiconductor chip 200 from the first adhesion layer 430 may be prevented.

The second semiconductor chip 300 may be a semiconductor chip attached to one surface of the first adhesion layer 430 and on the first semiconductor chip 200. The second semiconductor chip 300 may have an upper surface 300a and a lower surface 300b.

The second semiconductor chip 300 may include a second semiconductor substrate 310, a second chip pad 320, and a second passivation layer 330. Hereinafter, redundant descriptions between the first semiconductor chip 200 and the second semiconductor chip 300 will be omitted, and differences therebetween will be mainly described.

In an embodiment, a cross-sectional area of the second semiconductor chip 300 in the horizontal direction (i.e., a cross-sectional area on the X-Y plane) may be larger than a cross-sectional area of the first semiconductor chip 200 in the horizontal direction. The cross-sectional area of the second semiconductor chip 300 in the horizontal direction may be substantially the same as a cross-sectional area of the first adhesion layer 430 in the horizontal direction. Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

In an embodiment, the side surface of the second semiconductor chip 300 and the side surface of the first adhesion layer 430 may be coplanar with each other. The side surface of the second semiconductor chip 300 may be aligned with (i.e., may be coplanar to) the side surface of the first adhesion layer 430.

In an embodiment, the first semiconductor chip 200 and the second semiconductor chip 300 may be heterogeneous semiconductor chips. For example, the semiconductor package 10 may be a SIP in which different types of semiconductor chips are electrically connected to each other to operate as a single system.

For example, when the first semiconductor chip 200 is a memory semiconductor chip, the second semiconductor chip 300 may be a logic semiconductor chip. When the first semiconductor chip 200 is a logic semiconductor chip, the second semiconductor chip 300 may be a memory semiconductor chip.

In an embodiment, the second semiconductor substrate 310 may include a second active layer AL_2 which is adjacent to the upper surface 300a of the second semiconductor chip 300. The second active layer AL_2 of the second semiconductor chip 300 may face the upper surface of the semiconductor package 10. For example, a direction in which the second active layer AL_2 of the second semiconductor chip 300 faces may be opposite to a direction in which the first active layer AL_1 of the first semiconductor chip 200 faces.

In an embodiment, the second chip pad 320 may be a pad which is disposed on the second semiconductor substrate 310 and is electrically connected to a plurality of individual devices formed in the second active layer AL_2.

In an embodiment, the second passivation layer 330 may be on the second semiconductor substrate 310 and may surround a side surface of the second chip pad 320. The second passivation layer 330 may expose one surface of the second chip pad 320.

In an embodiment, the second active layer AL_2 of the second semiconductor chip 300 may face the upper surface of the semiconductor package 10, and the second semiconductor chip 300 may be connected to the package substrate 100 through wire bonding.

A first conductive wire w1 may be a wire of a conductive material connecting the second chip pad 320 of the second semiconductor chip 300 to the wire connection pad 140 of the package substrate 100.

In an embodiment, the first conductive wire w1 may include at least one material among gold (Au), silver (Ag), platinum (Pt), aluminum (Al), copper (Cu), palladium (Pd), nickel (Ni), cobalt (Co), chromium (Cr) and titanium (Ti).

The second adhesion layer 450 may be a layer in the recessed region H1 of the package substrate 100 and fixing the first semiconductor chip 200 in the recessed region H1. The second adhesion layer 450 may be a film having self-adhesive properties. For example, the second adhesion layer 450 may be a double-sided adhesive film.

In an embodiment, the thickness of the second adhesion layer 450 may be greater than the depth of the recessed region H1 of the package substrate 100. For example, a part of the second adhesion layer 450 may protrude upward from the first surface 100a of the package substrate 100. The thickness of the second adhesion layer 450 may be smaller than the thickness of the first adhesion layer 430.

In an embodiment, the cross-sectional area of the second adhesion layer 450 in the horizontal direction may be smaller than the cross-sectional area of the recessed region H1 of the package substrate 100 in the horizontal direction. However, the cross-sectional area of the second adhesion layer 450 in the horizontal direction is not limited thereto, and may be substantially the same as the cross-sectional area of the recessed region H1 of the package substrate 100 in the horizontal direction.

In an embodiment, the second adhesion layer 450 may be pressed onto the package substrate 100 while attached to the lower surface 200b of the first semiconductor chip 200. When the second adhesion layer 450 is attached to the lower surface 200b of the first semiconductor chip 200, the chip connection terminal 520 may contact the first chip pad 220, and the second adhesion layer 450 may surround the chip connection terminal 520. During a time when the second adhesion layer 450 is being pressed onto the package substrate 100, the chip connection terminal 520 may connect the first chip pad 220 and the chip connection pad 130.

The side surface of the second adhesion layer 450 and the side surface of the first semiconductor chip 200 may be coplanar with each other. The side surface of the second adhesion layer 450 may be aligned with (i.e., may be coplanar to) the side surface of the first semiconductor chip 200.

In an embodiment, the second adhesion layer 450 and the first semiconductor chip 200 may be manufactured at a wafer level. After the second adhesion layer 450 is applied on the wafer on which the plurality of first semiconductor chips 200 are formed, the wafer may be individualized, and thus the side surface of the second adhesion layer 450 and the side surface of the first semiconductor chip 200 may be coplanar with each other.

In an embodiment, a part of the second adhesion layer 450 may be surrounded by the insulating layer 120 of the package substrate 100, and the other part of the second adhesion layer 450 may be surrounded by the first adhesion layer 430. For example, a lower portion of the side surface of the second adhesion layer 450 may be surrounded by the insulating layer 120 of the package substrate 100, and an upper portion of the side surface of the second adhesion layer 450 may be surrounded by the second adhesion layer 450.

The molding layer 620 may be on the package substrate 100 and may surround the first adhesion layer 430, the second semiconductor chip 300, and the first conductive wire w1. The molding layer 620 may be a material including at least one of an insulating polymer and an epoxy resin. For example, the molding layer 620 may include an epoxy molding compound (EMC).

The external connection terminal 690 may be a terminal connected to the external connection pad 150 of the package substrate 100 and connecting the package substrate 100 to an external device. The external connection terminal 690 may be metal including at least one of silver (Ag), copper (Cu), and aluminum (Al).

The semiconductor package 10 according to an embodiment of the inventive concept may include the package substrate 100 including the recessed region H1 in the concave shape in the part adjacent to the first surface 100a and the first semiconductor chip 200 disposed in the recessed region H1 and connected to the package substrate 100. The recessed region H1 may reduce the thickness of the semiconductor package 10 and secure sufficient adhesion between the first semiconductor chip 200 and the package substrate 100.

The length (i.e., height) of the first semiconductor chip 200 of the semiconductor package 10 according to an embodiment of the inventive concept formed in the vertical direction from the second surface 100b of the package substrate 100 may be reduced by the depth of the recessed region H1 of the package substrate 100, and thus the adhesion between the first semiconductor chip 200 and the first adhesion layer 430 may be sufficient to secure structural reliability of the semiconductor package 10. For example, adhesion may be improved on the part where the side surface of the first semiconductor chip 200 and the first adhesion layer 430 contact each other, and separation of the semiconductor chip 200 from the first adhesion layer 430 may be prevented.

Figure 2:
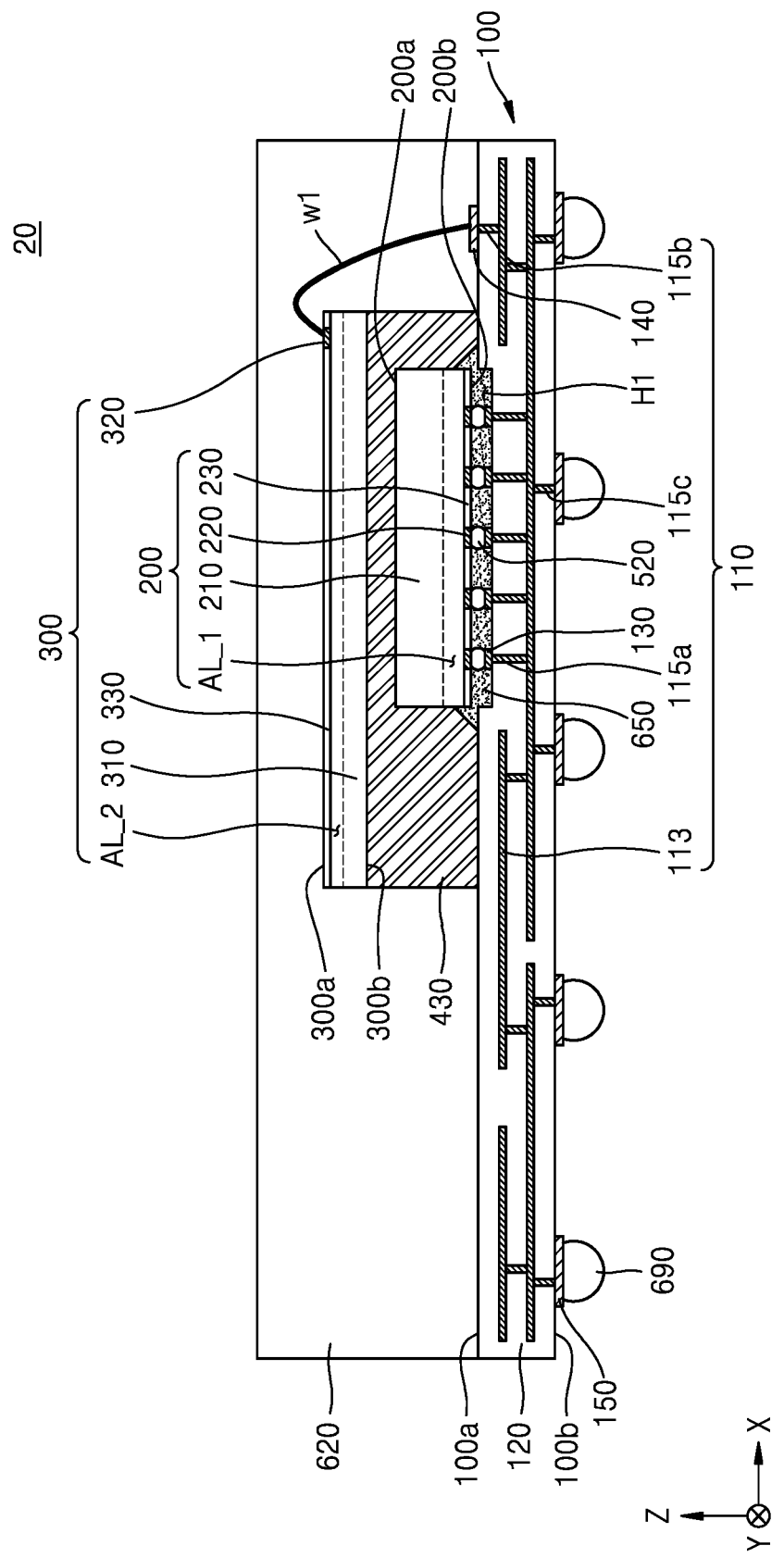
FIG. 2 is a cross-sectional view of a semiconductor package according to an embodiment of the inventive concept.

FIG. 2 is a cross-sectional view of a semiconductor package 20 according to an embodiment of the inventive concept. Hereinafter, redundant descriptions of the semiconductor package 10 of FIG. 1 will be omitted, and differences therebetween will be mainly described.

The semiconductor package 20 according to an embodiment of the inventive concept may include the package substrate 100, the first semiconductor chip 200, the second semiconductor chip 300, the first adhesion layer 430, the chip connection terminal 520, the first conductive wire w1, the first molding layer 620, a second molding layer 650, the external connection terminal 690, and the like.

The semiconductor package 20 of FIG. 2 does not include the second adhesion layer 450 described with reference to FIG. 1, but may instead include the second molding layer 650.

The second molding layer 650 may be a layer which fills the recessed region H1 of the package substrate 100 and fixes the first semiconductor chip 200 to the package substrate 100.

In an embodiment, the second molding layer 650 may surround the chip connection terminal 520 in the recessed region H1 of the package substrate 100. A part of the second molding layer 650 may contact the first surface 100a of the package substrate 100 in the periphery of the recessed region H1 of the package substrate 100. A part of the second molding layer 650 may surround a part of the side surface of the first semiconductor chip 200.

In an embodiment, the second molding layer 650 may have a tapered shape in which the cross-sectional area in the horizontal direction increases as the second molding layer 650 is closer to the first surface 100a of the package substrate 100 in the vertical direction.

In an embodiment, after the first semiconductor chip 200 is disposed on the recessed region H1 of the package substrate 100, the second molding layer 650 may fill a space between the first semiconductor chip 200 and the package substrate 100.

For example, after the first semiconductor chip 200 and the package substrate 100 are connected with each other by the chip connection terminal 520, the second molding layer 650 may be injected into the recessed region H1 of the package substrate 100. The second molding layer 650 may be injected into the space between the package substrate 100 and the first semiconductor chip 200.

In an embodiment, while the second molding layer 650 is injected into the recessed region H1, the second molding layer 650 may surround the chip connection terminal 520. When the second molding layer 650 is continuously injected into the recessed region H1, the second molding layer 650 may be positioned beyond the space of the recessed region H1, and may surround a part of the side the first semiconductor chip 200.

In an embodiment, the second molding layer 650 may be a material including at least one of an insulating polymer and an epoxy resin. For example, the second molding layer 650 may include an epoxy molding compound (EMC). Further, the material of the second molding layer 650 may include substantially the same material as the first molding layer 620.

In an embodiment, a boundary surface between the second molding layer 650 and the first adhesion layer 430 may be inclined. For example, the boundary surface between the second molding layer 650 and the first adhesion layer 430 may be inclined downward farther away from the recessed region H1 of the package substrate 100 in the horizontal direction.

In an embodiment, a lower portion of the side surface of the first semiconductor chip 200 may be surrounded by the second molding layer 650, and an upper portion of the side surface of the first semiconductor chip 200 may be surrounded by the first adhesion layer 430

Figure 3:
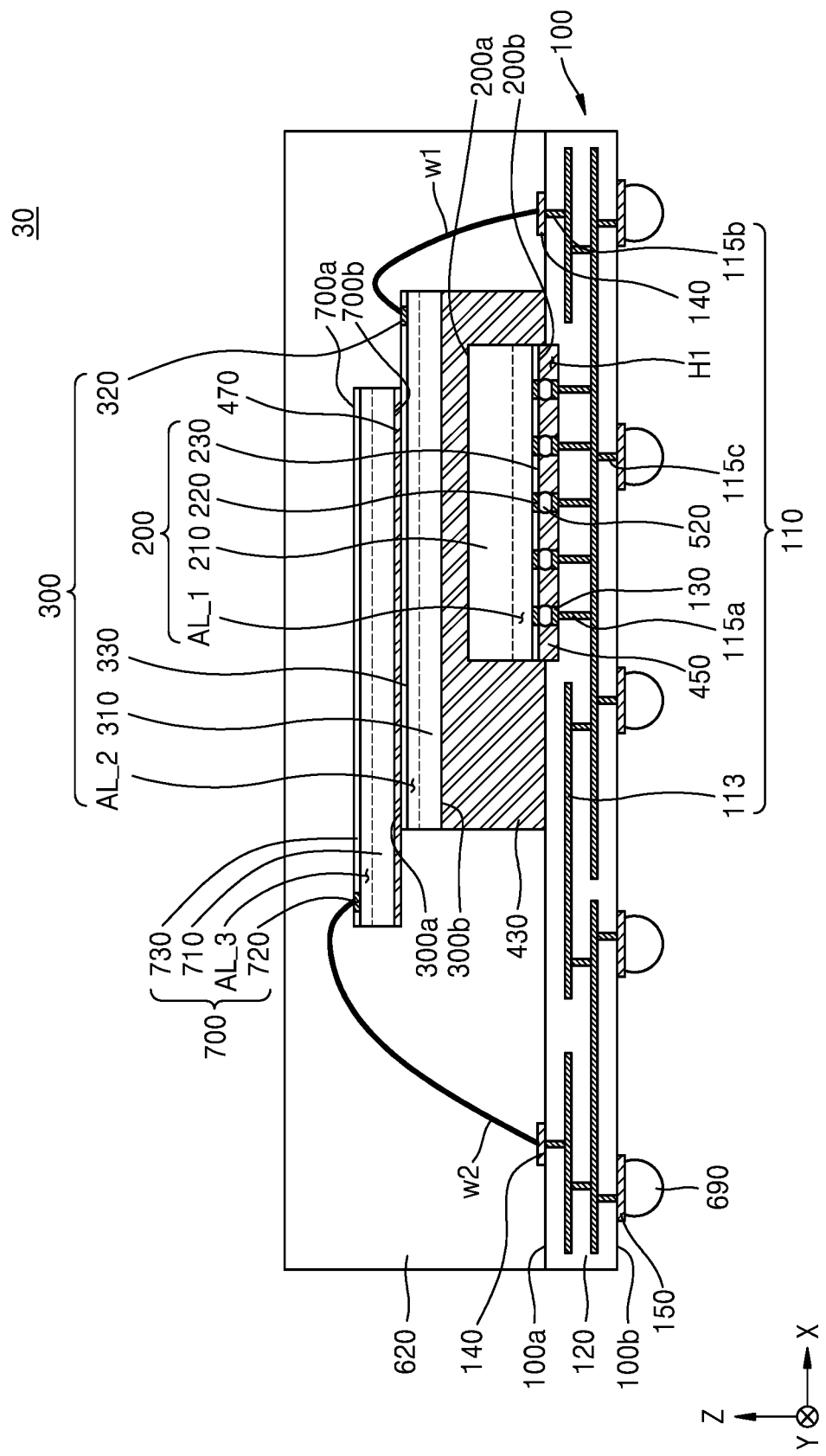
FIG. 3 is a cross-sectional view of a semiconductor package according to an embodiment of the inventive concept.

FIG. 3 is a cross-sectional view of a semiconductor package 30 according to an embodiment of the inventive concept.

Hereinafter, redundant descriptions of the semiconductor package 10 of FIG. 1 will be omitted, and differences therebetween will be mainly described.

The semiconductor package 30 according to an embodiment of the inventive concept may include the package substrate 100, the first semiconductor chip 200, the second semiconductor chip 300, a third semiconductor chip 700, the first adhesion layer 430, a second adhesion layer 450, a third adhesion layer 470, the chip connection terminal 520, the first conductive wire w1, a second conductive wire w2, the molding layer 620, the external connection terminal 690, and the like.

In an embodiment, the third semiconductor chip 700 may be a semiconductor chip mounted on the second semiconductor chip 300. The third semiconductor chip 700 may have an upper surface 700a and a lower surface 700b. The third semiconductor chip 700 may be a memory semiconductor chip or a logic semiconductor chip.

In an embodiment, the third semiconductor chip 700 may be mounted on the second semiconductor chip 300 such that the side surface of the second semiconductor chip 300 and the side surface of the third semiconductor chip 700 are not coplanar with each other. Accordingly, the second chip pad 320 of the second semiconductor chip 300 may be exposed without being covered by the third semiconductor chip 700.

In an embodiment, the third semiconductor chip 700 may include a third semiconductor substrate 710, a third chip pad 720, and a third passivation layer 730. The third semiconductor substrate 710 may include a third active layer AL_3 which is adjacent to the upper surface 700a of the third semiconductor chip 700.

In an embodiment, the third active layer AL_3 of the third semiconductor chip 700 may face the upper surface of the semiconductor package 30. For example, a direction in which the third active layer AL_3 of the third semiconductor chip 700 faces may be opposite to a direction in which the first active layer AL_1 of the first semiconductor chip 200 faces. The direction in which the third active layer AL_3 of the third semiconductor chip 700 faces may be substantially the same as a direction in which the second active layer AL_2 of the second semiconductor chip 300 faces.

In an embodiment, the third chip pad 720 may be a pad which is disposed on the third semiconductor substrate 710 and is electrically connected to a plurality of individual devices formed in the third active layer AL_3.

In an embodiment, the third passivation layer 730 may be on the third semiconductor substrate 710 and may surround a side surface of the third chip pad 720. The third passivation layer 730 may expose one surface of the third chip pad 720.

In an embodiment, the third active layer AL_3 of the third semiconductor chip 700 may face the upper surface of the semiconductor package 30, and the third semiconductor chip 700 may be connected to the package substrate 100 through wire bonding.

The third adhesion layer 470 may be a layer that fixes the third semiconductor chip 700 on the second semiconductor chip 300. The third adhesion layer 470 may be interposed between the second semiconductor chip 300 and the third semiconductor chip 700.

In an embodiment, the third adhesion layer 470 may be a tape-type material layer, a liquid-coated curing material layer, or a combination thereof. The third adhesion layer 470 may include or may be formed of a thermal setting structure, thermal plastic, a UV cure material, or a combination thereof. The material of the third adhesion layer 470 may be substantially the same as the material of the first adhesion layer 430 and the second adhesion layer 450 described above.

In an embodiment, a side surface of the third adhesion layer 470 and a side surface of the third semiconductor chip 700 may be coplanar with each other. The side surface of the third adhesion layer 470 may be aligned with (i.e., may be coplanar to" the side surface of the third semiconductor chip 700.

In an embodiment, the third adhesion layer 470 and the third semiconductor chip 700 may be manufactured at a wafer level. After the third adhesion layer 470 is applied on the wafer on which the plurality of third semiconductor chips 700 are formed, the wafer may be individualized, and thus the side surface of the third adhesion layer 470 and the side surface of the third semiconductor chips 700 may be coplanar with each other.

In an embodiment, the first conductive wire w1 may be a wire of a conductive material connecting the second chip pad 320 of the second semiconductor chip 300 to the wire connection pad 140 of the package substrate 100. The second conductive wire w2 may be a conductive wire connecting the third chip pad 720 of the third semiconductor chip 700 to the wire connection pad 140 of the package substrate 100.

In an embodiment, the first conductive wire w1 and the second conductive wire w2 may include at least one material among gold (Au), silver (Ag), platinum (Pt), aluminum (Al), copper (Cu), palladium (Pd), nickel (Ni), cobalt (Co), chromium (Cr) and titanium (Ti).

Figure 4:
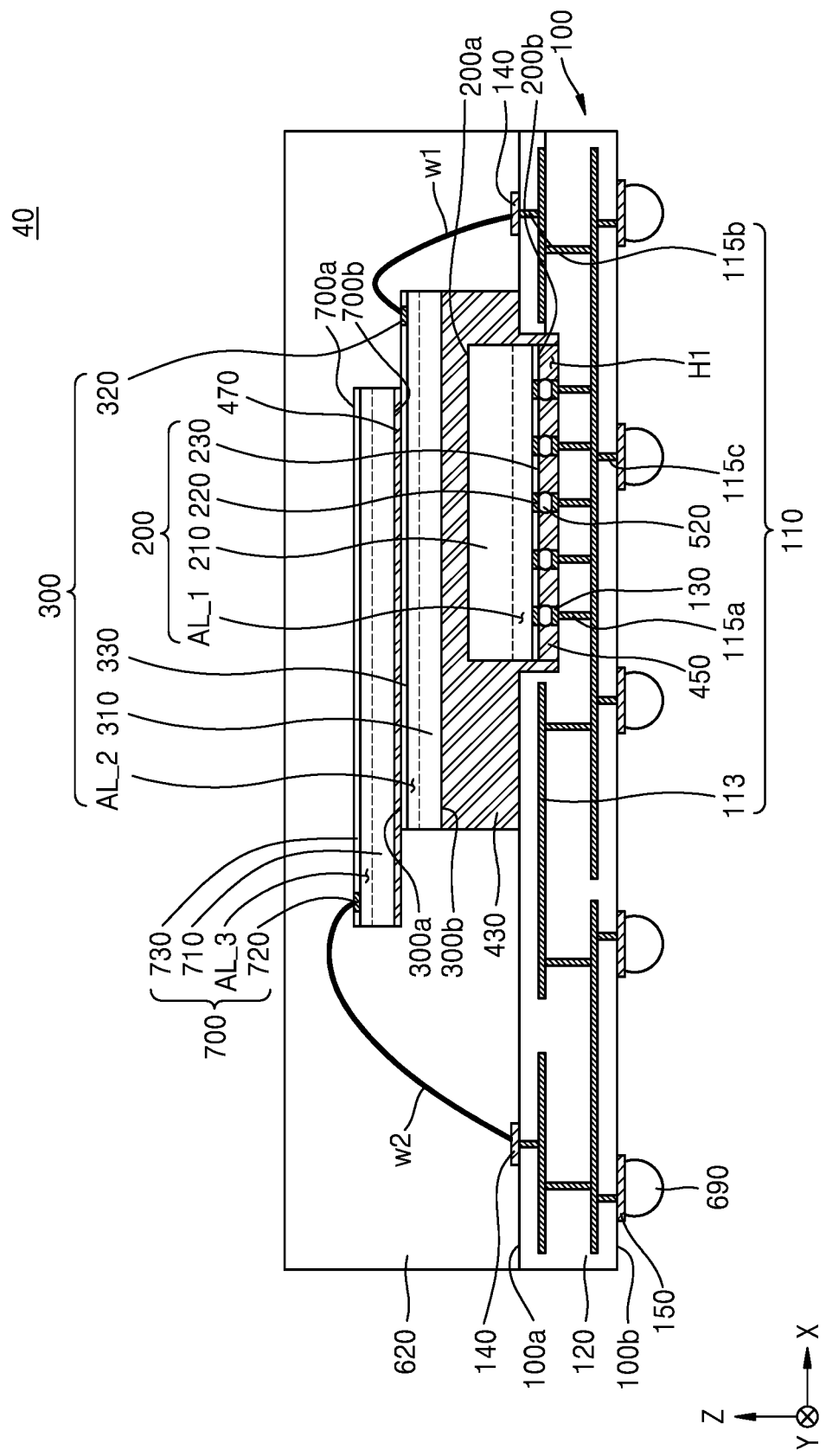
FIG. 4 is a cross-sectional view of a semiconductor package according to an embodiment of the inventive concept.

FIG. 4 is a cross-sectional view of a semiconductor package 40 according to an embodiment of the inventive concept.

Hereinafter, redundant descriptions of the semiconductor package 30 of FIG. 3 will be omitted, and differences therebetween will be mainly described.

The semiconductor package 40 according to an embodiment of the inventive concept may include the package substrate 100, the first semiconductor chip 200, the second semiconductor chip 300, the third semiconductor chip 700, the first adhesion layer 430, the second adhesion layer 450, the third adhesion layer 470, the chip connection terminal 520, the first conductive wire w1, a second conductive wire w2, the molding layer 620, the external connection terminal 690, and the like.

In an embodiment, at least a part of the first semiconductor chip 200 may be surrounded by an inner wall formed by the recessed region H1 of the package substrate 100. At least a part of the first semiconductor chip 200 may be inserted into the recessed region H1 of the package substrate 100. For example, a level of the lower surface 200*b* of the first semiconductor chip 200 may be lower than a level of the first surface 100*a* of the package substrate 100.

In an embodiment, the cross-sectional area of the recessed region H1 of the package substrate 100 in the horizontal direction may be larger than the cross-sectional area of the first semiconductor chip 200 in the horizontal direction. A part of the first adhesion layer 430 may be in the recessed region H1 of the package substrate 100.

In an embodiment, a part of the first adhesion layer 430 may surround the side surface of the first semiconductor chip 200 and the side surface of the second adhesion layer 450 in the recessed region H1 of the package substrate 100.

In an embodiment, the side surface of the first semiconductor chip 200 and the side surface of the second adhesion layer 450 may be coplanar with each other. The side of the first semiconductor chip 200 and the side of the second adhesion layer 450 may be aligned with each other. The part of the first adhesion layer 430 may be formed in the recessed region H1 of the package substrate 100, and contact the side of the first semiconductor chip 200 and the side of the second adhesion layer 450.

At least a part of the first semiconductor chip 200 of the semiconductor package 40 according to an embodiment of the inventive concept may be accommodated in the recessed region H1 of the package substrate 100. The recessed region H1 may reduce the thickness of the semiconductor package 40 and secure sufficient adhesion between the first semiconductor chip 200 and the package substrate 100.

The length (i.e., the height) of the first semiconductor chip 200 of the semiconductor package 40 according to an embodiment of the inventive concept formed in the vertical direction from the second surface 100*b* of the package substrate 100 may be reduced by the depth of the recessed region H1 of the package substrate 100, and thus the adhesion between the first semiconductor chip 200 and the first adhesion layer 430 may be sufficient to secure structural reliability of the semiconductor package 40. For example, adhesion may be improved on the part where the side surface of the first semiconductor chip 200 and the first adhesion layer 430 contact each other, and separation of the first semiconductor chip 200 from the first adhesion layer 430 may be prevented.

Figure 5:
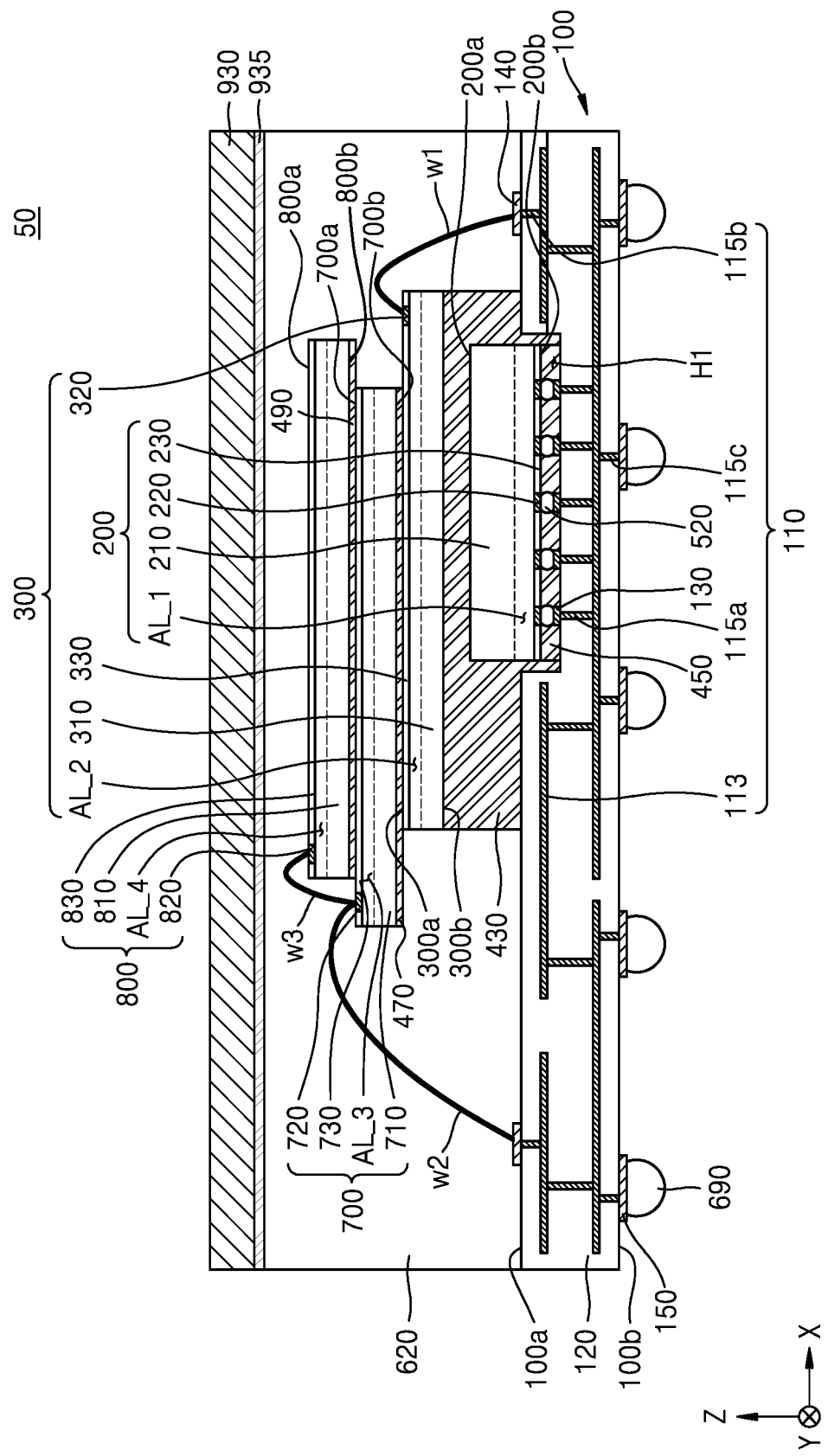
FIG. 5 is a cross-sectional view of a semiconductor package according to an embodiment of the inventive concept.

FIG. 5 is a cross-sectional view of a semiconductor package 50 according to an embodiment of the inventive concept.

Hereinafter, redundant descriptions of the semiconductor package 40 of FIG. 4 will be omitted, and differences therebetween will be mainly described.

The semiconductor package 50 of FIG. 5 may include the package substrate 100, the first semiconductor chip 200, the second semiconductor chip 300, a third semiconductor chip 700, a fourth semiconductor chip 800, the first adhesion layer 430, the second adhesion layer 450, the third adhesion layer 470, a fourth adhesion layer 490, the chip connection terminal 520, the first conductive wire w1, a second conductive wire w2, a third conductive wire w3, the molding layer 620, the external connection terminal 690, a heat dissipating member 930, and the like.

In an embodiment, the fourth semiconductor chip 800 may be a semiconductor chip mounted on the third semiconductor chip 700. The fourth semiconductor chip 800 may have an upper surface 800*a* and a lower surface 800*b*. The fourth semiconductor chip 800 may be a memory semiconductor chip or a logic semiconductor chip.

In an embodiment, the fourth semiconductor chip 800 may be mounted on the second semiconductor chip 300 such that the side surface of the third semiconductor chip 700 and the side surface of the fourth semiconductor chip 800 are not coplanar with each other. Accordingly, the third chip pad 720 of the third semiconductor chip 700 may be exposed without being covered by the fourth semiconductor chip 800.

In an embodiment, the fourth semiconductor chip 800 may include a fourth semiconductor substrate 810, a fourth chip pad 820, and a fourth passivation layer 830. The fourth semiconductor substrate 810 may include a fourth active layer AL_4 which is adjacent to the upper surface 800*a* of the fourth semiconductor chip 800.

In an embodiment, the fourth active layer AL_4 of the fourth semiconductor chip 800 may face the upper surface of the semiconductor package 50. For example, a direction in which the fourth active layer AL_4 of the fourth semiconductor chip 800 faces may be opposite to a direction in which the first active layer AL_1 of the first semiconductor chip 200 faces. A direction in which the fourth active layer AL_4 of the fourth semiconductor chip 800 faces may be substantially the same as a direction in which the second active layer AL_2 of the second semiconductor chip 300 faces and a direction in which the third active layer AL_3 of the third semiconductor chip 700 faces.

In an embodiment, the fourth chip pad 820 may be a pad which is disposed on the fourth semiconductor substrate 810 and is electrically connected to a plurality of individual devices formed in the fourth active layer AL_4.

In an embodiment, the fourth passivation layer 830 may be on the fourth semiconductor substrate 810 and may surround a side surface of the fourth chip pad 820. The fourth passivation layer 830 may expose one surface of the fourth chip pad 820.

In an embodiment, the fourth active layer AL_4 of the fourth semiconductor chip 800 may face the upper surface of the semiconductor package 50, and the fourth semiconductor chip 800 may be connected to the third semiconductor chip 700 through wire bonding.

The fourth adhesion layer 490 may be a layer that fixes the fourth semiconductor chip 800 on the third semiconductor chip 700. The fourth adhesion layer 490 may be interposed between the third semiconductor chip 700 and the fourth semiconductor chip 800.

In an embodiment, a side surface of the fourth adhesion layer 490 and a side surface of the fourth semiconductor chip 800 may be coplanar with each other. The side surface of the fourth adhesion layer 490 may be aligned with (i.e., may be coplanar to) the side surface of the fourth semiconductor chip 800.

In an embodiment, each of the semiconductor packages 10 to 50 described with reference to FIGS. 1 to 5 includes 2 to 4 semiconductor chips, but each of the semiconductor packages 10 to 50 may include 5 or more semiconductor chips. The semiconductor chips included in the semiconductor packages 10 to 50 may be stacked in the vertical direction and may be electrically connected to a package substrate through flip chip bonding or wire bonding.

The third conductive wire w3 may be a wire of a conductive material connecting the fourth chip pad 820 of the fourth semiconductor chip 800 to the third chip pad 720 of the third semiconductor chip 700. The fourth semiconductor chip 800 may be connected to the third semiconductor chip 700 through the third conductive wire w3.

The heat dissipating member 930 may be a member attached on the molding layer 620 and dissipating heat generated from the first to fourth semiconductor chips 200, 300, 700, and 800 to the outside. In an embodiment, the heat dissipating member 930 may be a heat slug or a heat sink. For example, the heat slug or the heat sink may have a concave-convex structure shape (e.g., a corrugated shape) in which concaveness and convexity are repeated to increase their surface areas.

In an embodiment, the heat dissipating member 930 may include at least one material of a metal material, a ceramic material, a carbon material, and a polymer material having excellent thermal conductivity. For example, the heat dissipating member 930 may include at least one metallic material among copper (Cu), aluminum (Al), magnesium (Mg), nickel (Ni), and silver (Ag), but is limited thereto.

In an embodiment, a thermal interface material (TIM) 935 may be in a lower portion of the heat dissipating member 930. For example, the TIM 935 may be interposed between the lower surface of the heat dissipating member 90 and the upper surface of the first molding layer 620.

Hereinafter, a method S100 of manufacturing a semiconductor package according to an embodiment of the inventive concept will be described with reference to FIGS. 6 to 13. The method S100 of manufacturing the semiconductor package may be a method of manufacturing the semiconductor package 10 described with reference to FIG. 1.

Figure 6:
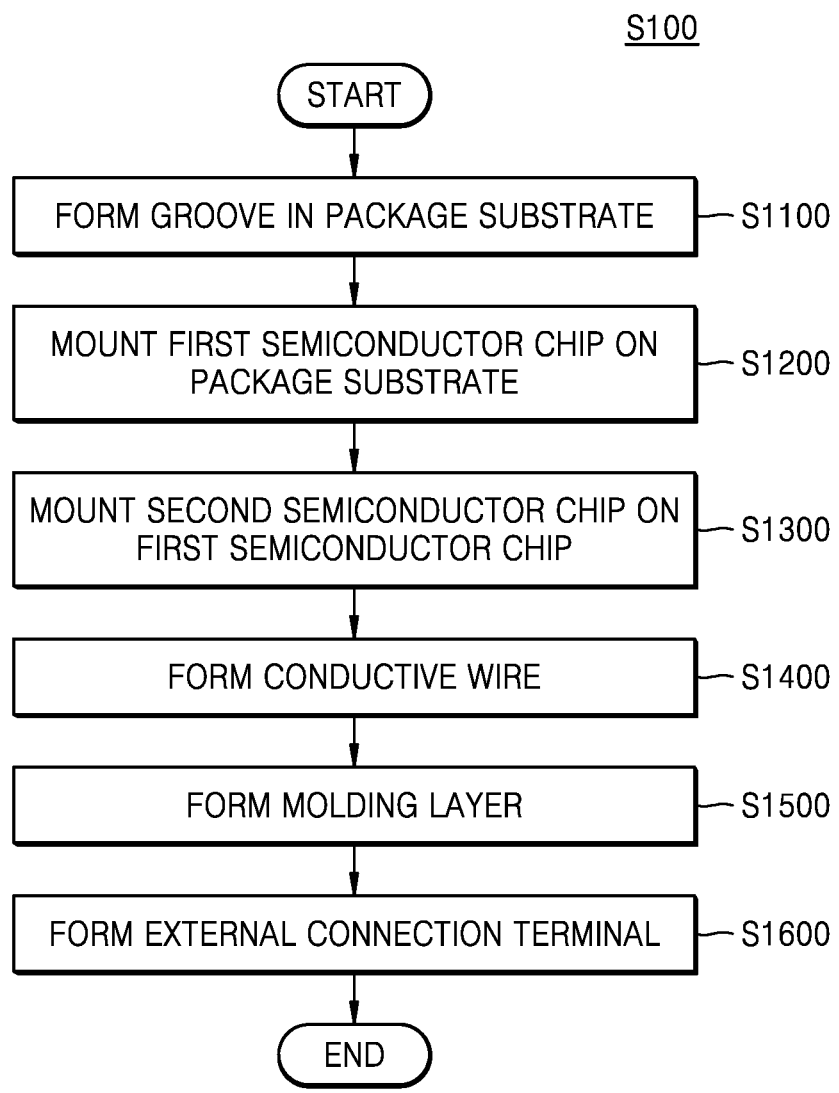
FIG. 6 is a flowchart showing a method of manufacturing a semiconductor package according to an embodiment of the inventive concept.

FIG. 6 is a flowchart showing the method S100 of manufacturing the semiconductor package 10 according to an embodiment of the inventive concept, and FIGS. 7 to 13 are diagrams showing operations of the method S100 of manufacturing the semiconductor package 10.

Referring to FIG. 6, the method S100 of manufacturing the semiconductor package 10 may include operation S1100 of forming the recessed region H1 in the package substrate 100, operation S1200 of mounting the first semiconductor chip 200 on the package substrate 100, operation S1300 of mounting the second semiconductor chip 300 on the first semiconductor chip 200, operation S1400 of forming the first conductive wire w1, operation S1500 of forming the molding layer 620, and operation S1600 of forming the external connection terminal 690.

Figure 7:
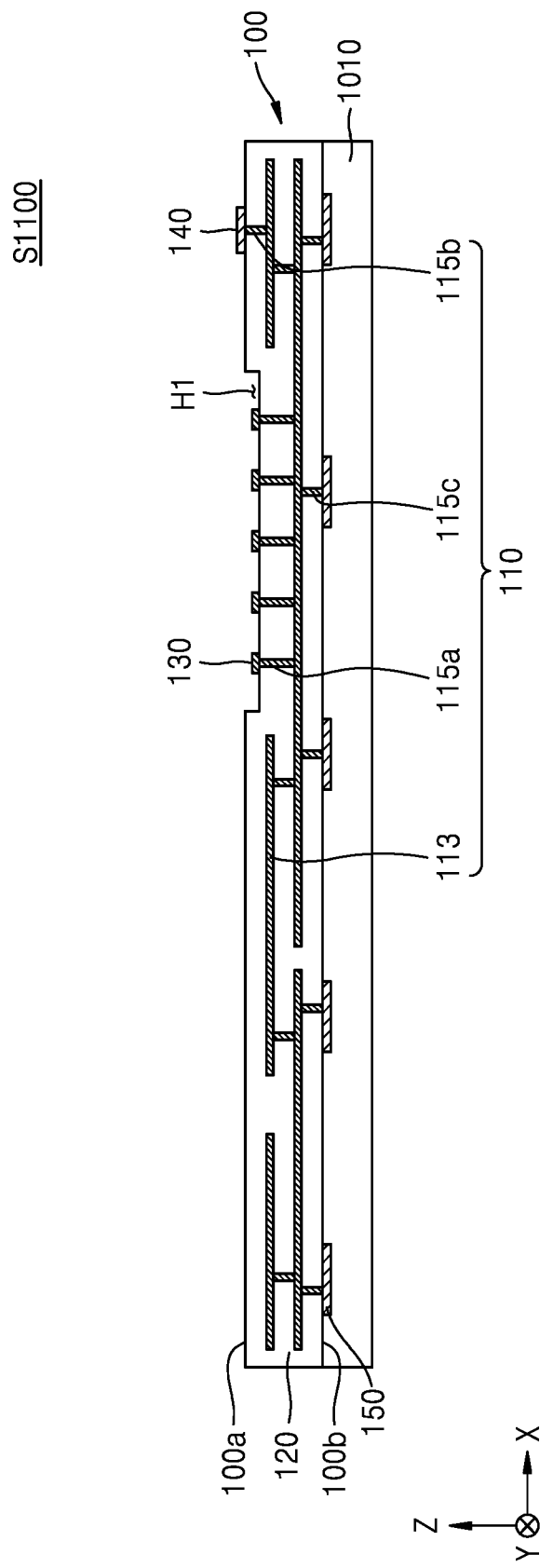
FIGS. 7 to 13 are diagrams showing operations of a method of manufacturing a semiconductor package according to an embodiment of the inventive concept.

Referring to FIGS. 6 and 7 together, the method S100 of manufacturing the semiconductor package 10 according to an embodiment of the inventive concept may include operation S1100 of forming the recessed region H1 in the package substrate 100.

Before performing operation S1100, an operation of attaching the support substrate 1010 to the second surface 100b of the package substrate 100 may be performed. The support substrate 1010 may be a substrate having stability with respect to a photolithography process, an etching process, a baking process, etc.

In an embodiment, when the support substrate 1010 is to be separated and removed by laser ablation, the support substrate 1010 may include a translucent substrate. When the support substrate 1010 is to be separated and removed by heating, the support substrate 1010 may include a heat-resistant substrate.

In an embodiment, the support substrate 1010 may be a glass substrate, but is not limited thereto. The support substrate 1010 may include a heat-resistant organic polymer material such as polyimide (PI), polyetheretherketone (PEEK), polyethersulfone (PES), polyphenylene sulfide (PPS), etc., but is not limited thereto.

Operation S1100 may include operations of forming the recessed region H1 in the package substrate 100 to expose the second redistribution via pattern 115b and forming the chip connection pad 130 on the second redistribution via pattern 115b.

In an embodiment, the recessed region H1 of the package substrate 100 may be formed through an etching process or a laser drilling process. However, the recessed region H1 is not limited thereto, and may be formed in the package substrate 100 through various methods.

In an embodiment, the recessed region H1 of the package substrate 100 may have a depth from 1 micrometer to 20 micrometers. The cross-sectional area of the recessed region H1 of the package substrate 100 in the horizontal direction may be larger than the cross-sectional area of the first semiconductor chip 200 positioned on the recessed region H1 in the horizontal direction.

In an embodiment, the chip connection pad 130 may be connected to the second redistribution via pattern 115b exposed by the recessed region H1 of the package substrate 100. The chip connection pad 130 may be in the recessed region H1 of the package substrate 100 such that a level of the upper surface of the chip connection pad 130 may be lower than a level of the upper surface of the wire connection pad 140.

Figure 8:
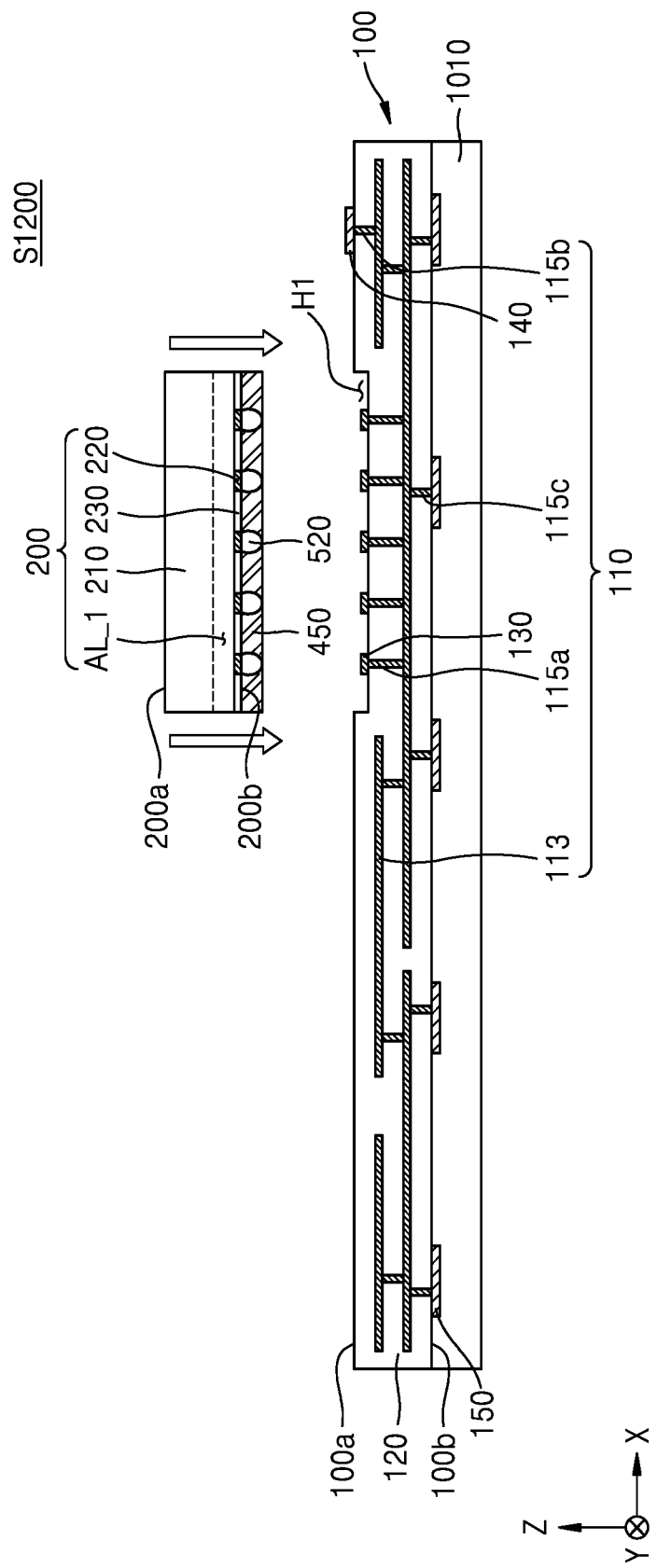

Referring to FIGS. 6 and 8 together, the method S100 of manufacturing the semiconductor package 10 according to an embodiment of the inventive concept may include operation S1200 of mounting the first semiconductor chip 200 on the package substrate 100.

Operation S1200 may be an operation of mounting the first semiconductor chip 200 on the package substrate 100 through flip-chip bonding.

In an embodiment, the chip connection terminal 520 may be attached to the lower surface 200b of the first semiconductor chip 200. For example, the chip connection terminal 520 may be attached to one surface of the first chip pad 220 of the first semiconductor chip 200.

In an embodiment, the second adhesion layer 450 may be attached to the lower surface 200b of the first semiconductor chip 200, and the second adhesion layer 450 may surround the chip connection terminal 520.

In operation S1200, while the first semiconductor chip 200 is flip-chip bonded to the package substrate 100, the chip connection terminal 520 may connect the first chip pad 220 and the chip connection pad 130.

In an embodiment, the second adhesion layer 450 and the first semiconductor chip 200 may be manufactured at a wafer level. After the second adhesion layer 450 is applied on the wafer on which the plurality of first semiconductor chips 200 are formed, the wafer may be individualized, and thus the side surface of the second adhesion layer 450 and the side surface of the first semiconductor chip 200 may be coplanar with each other.

However, the inventive concept is not limited to the above, and as described with reference to FIG. 2, after the first semiconductor chip 200 and the package substrate 100 are connected with each other by the chip connection terminal 520, the second molding layer 650 (of FIG. 2) may be injected into the recessed region H1 of the package substrate 100. The second molding layer 650 may be injected into a space between the package substrate 100 and the first semiconductor chip 200.

In an embodiment, while the second molding layer 650 (of FIG. 2) is injected into the recessed region H1, the second molding layer 650 (of FIG. 2) may surround the chip connection terminal 520. When the second molding layer 650 (of FIG. 2) is continuously injected into the recessed region H1, the second molding layer 650 (of FIG. 2) may be positioned beyond the space of the recessed region H1, and may surround a part of the side surface of the first semiconductor chip 200.

Figure 9:
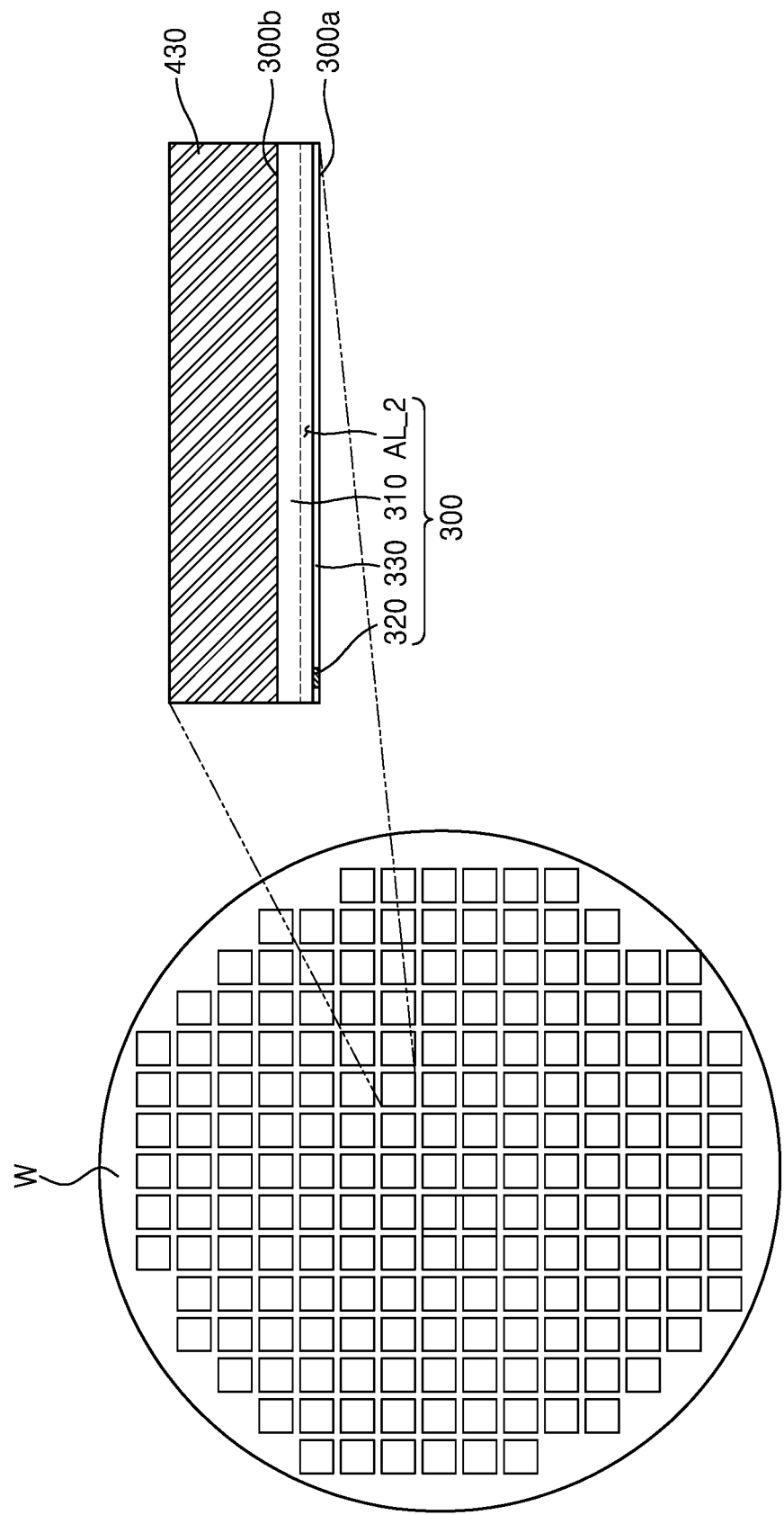
Figure 10:
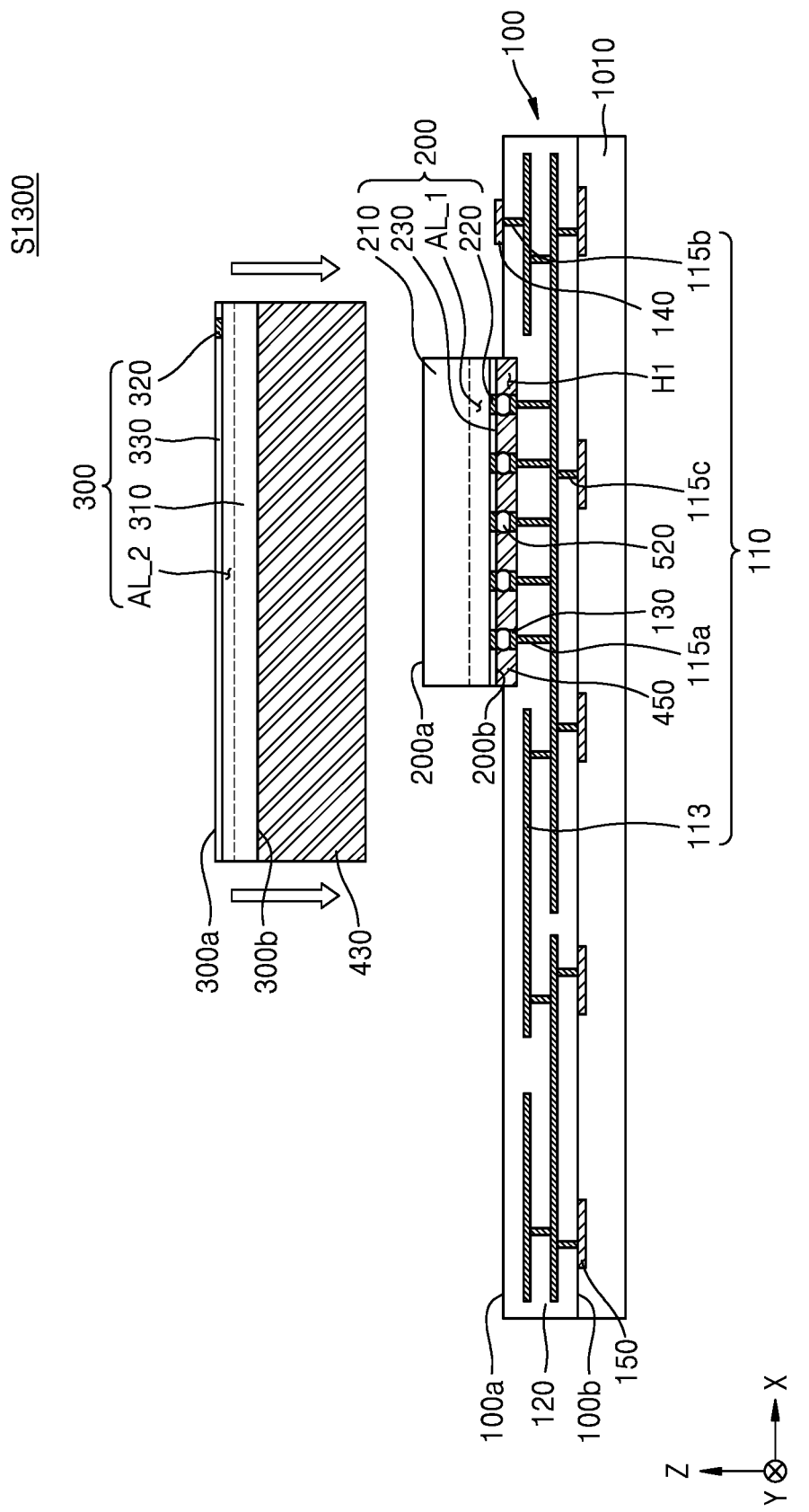

Referring to FIGS. 6, 9, and 10 together, the method S100 of manufacturing the semiconductor package 10 according to an embodiment of the inventive concept may include operation S1300 of mounting the second semiconductor chip 300 on the first semiconductor chip 200.

Referring to FIG. 9, the first adhesion layer 430 and the second semiconductor chip 300 may be manufactured at the wafer level. After the first adhesion layer 430 is applied on a wafer W on which the plurality of second semiconductor chips 300 are formed, the wafer W may be individualized, and thus the side surface of the first adhesion layer 430 and the side surface of the second semiconductor chip 300 may be coplanar with each other.

Referring to FIG. 10, the first adhesion layer 430 may be attached to the lower surface 300b of the second semiconductor chip 300. In an embodiment, the thickness of the first adhesion layer 430 attached to the second semiconductor chip 300 may be greater than the thickness of the first semiconductor chip 200. The thickness of the first adhesion layer 430 may have a value from about 90 micrometers to about 135 micrometers. For example, the thickness of the first adhesion layer 430 may be 110 micrometers.

In operation S1300, while the second semiconductor chip 300 is pressed onto the first surface 100a of the package substrate 100, the first adhesion layer 430 may surround the side and upper surfaces of the first semiconductor chip 200.

In an embodiment, the first adhesion layer 430 may surround at least a part of the side surface of the first semiconductor chip 200 and the side surface of the second adhesion layer 450.

Figure 11:
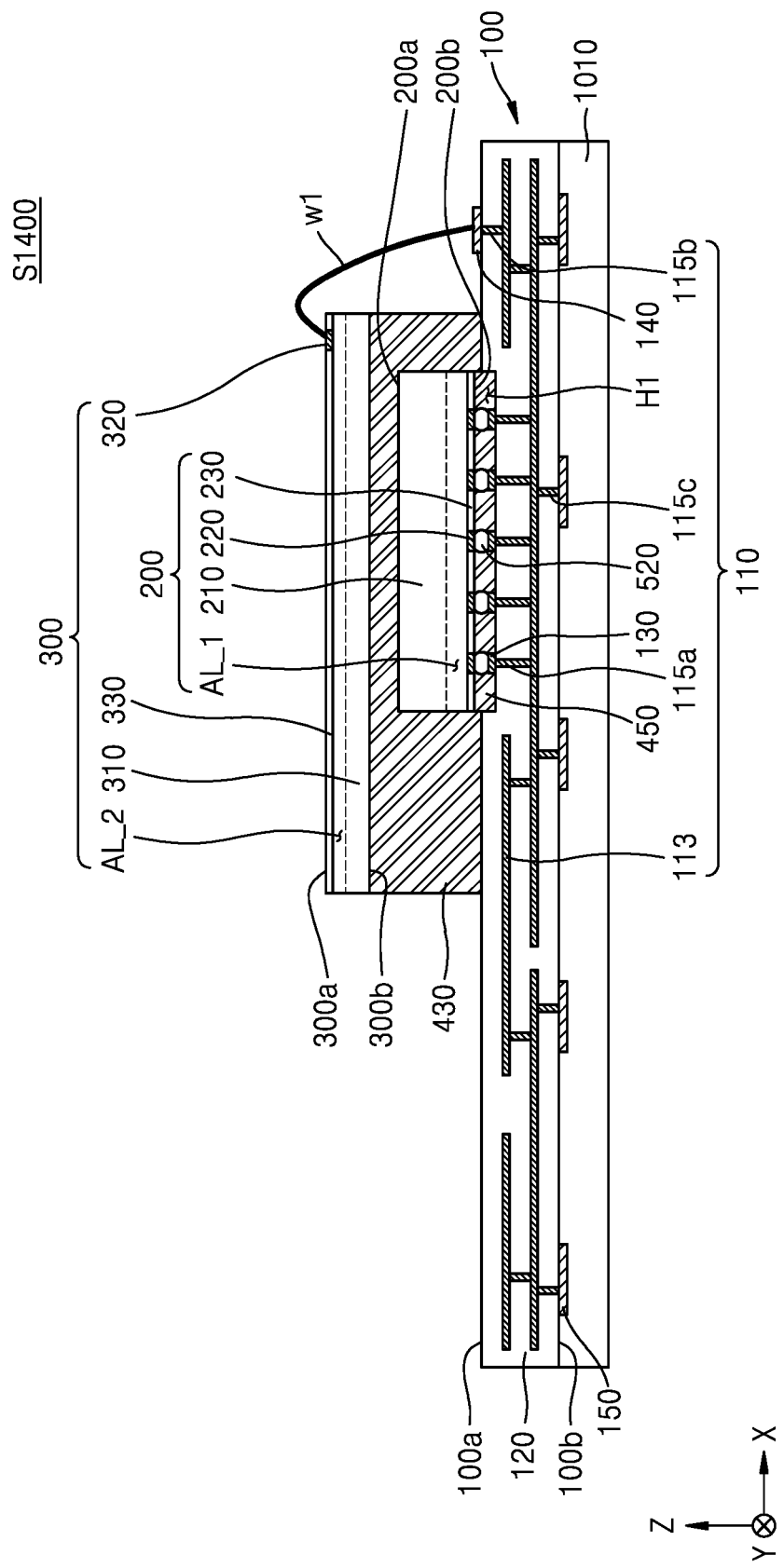

Referring to FIGS. 6 and 11, the method S100 of manufacturing the semiconductor package 10 according to the embodiment of the inventive concept may include operation S1400 of forming the first conductive wire w1.

Operation S1400 may be an operation of connecting the second semiconductor chip 300 and the package substrate 100 with each other through wire bonding. In an embodiment, the first conductive wire w1 may connect the second chip pad 320 of the second semiconductor chip 300 and the wire connection pad 140 of the package substrate 100.

Figure 12:
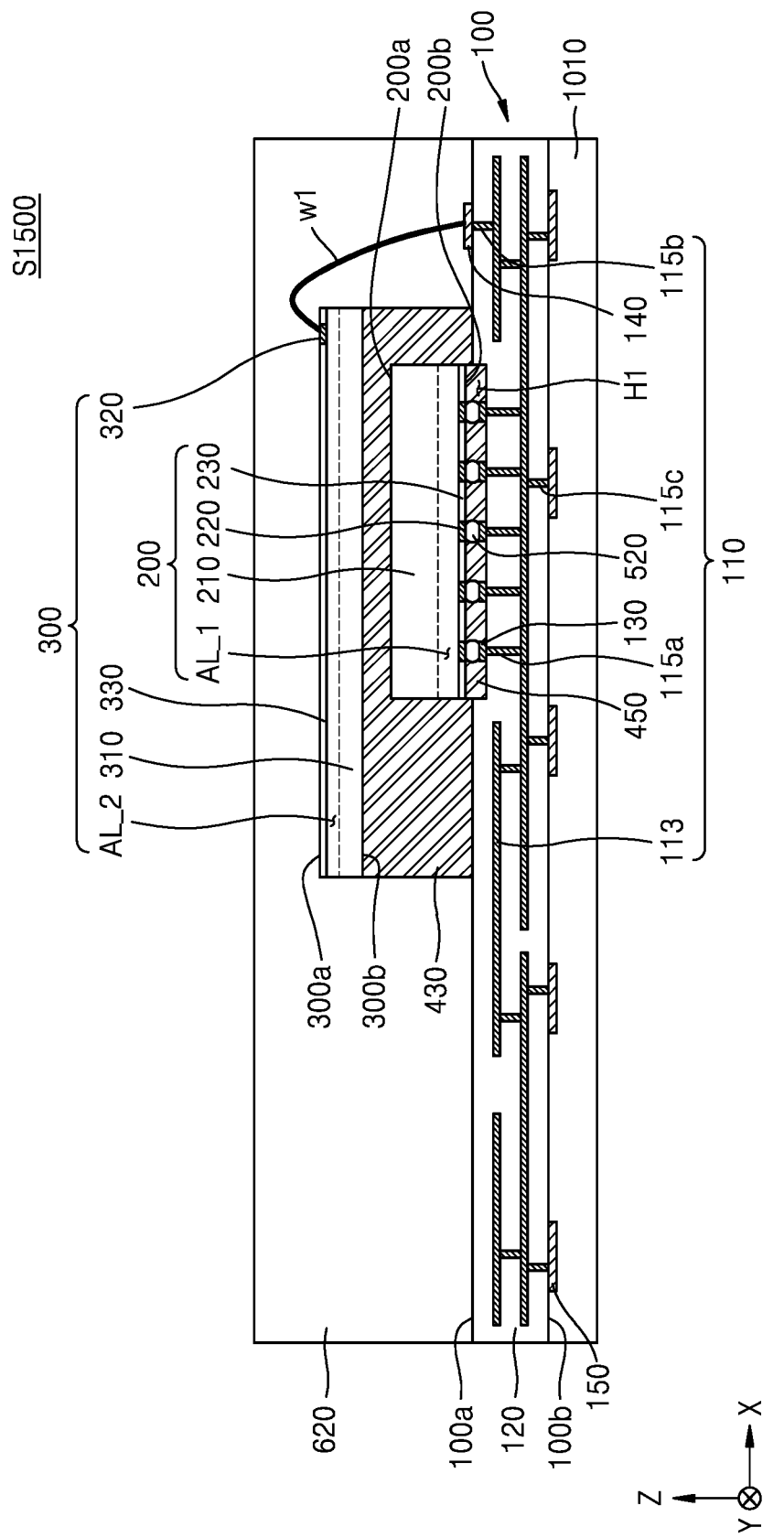

Referring to FIGS. 6 and 12, the method S100 of manufacturing the semiconductor package 10 according to an embodiment of the inventive concept may include operation S1500 of forming the molding layer 620.

In operation S1500, the molding layer 620 may be formed on the package substrate 100, and may surround the second semiconductor chip 300, the first adhesion layer 430, and the first conductive wire w1. The molding layer 620 may be a material including at least one of an insulating polymer and an epoxy resin. For example, the molding layer 60 may include an EMC.

Figure 13:
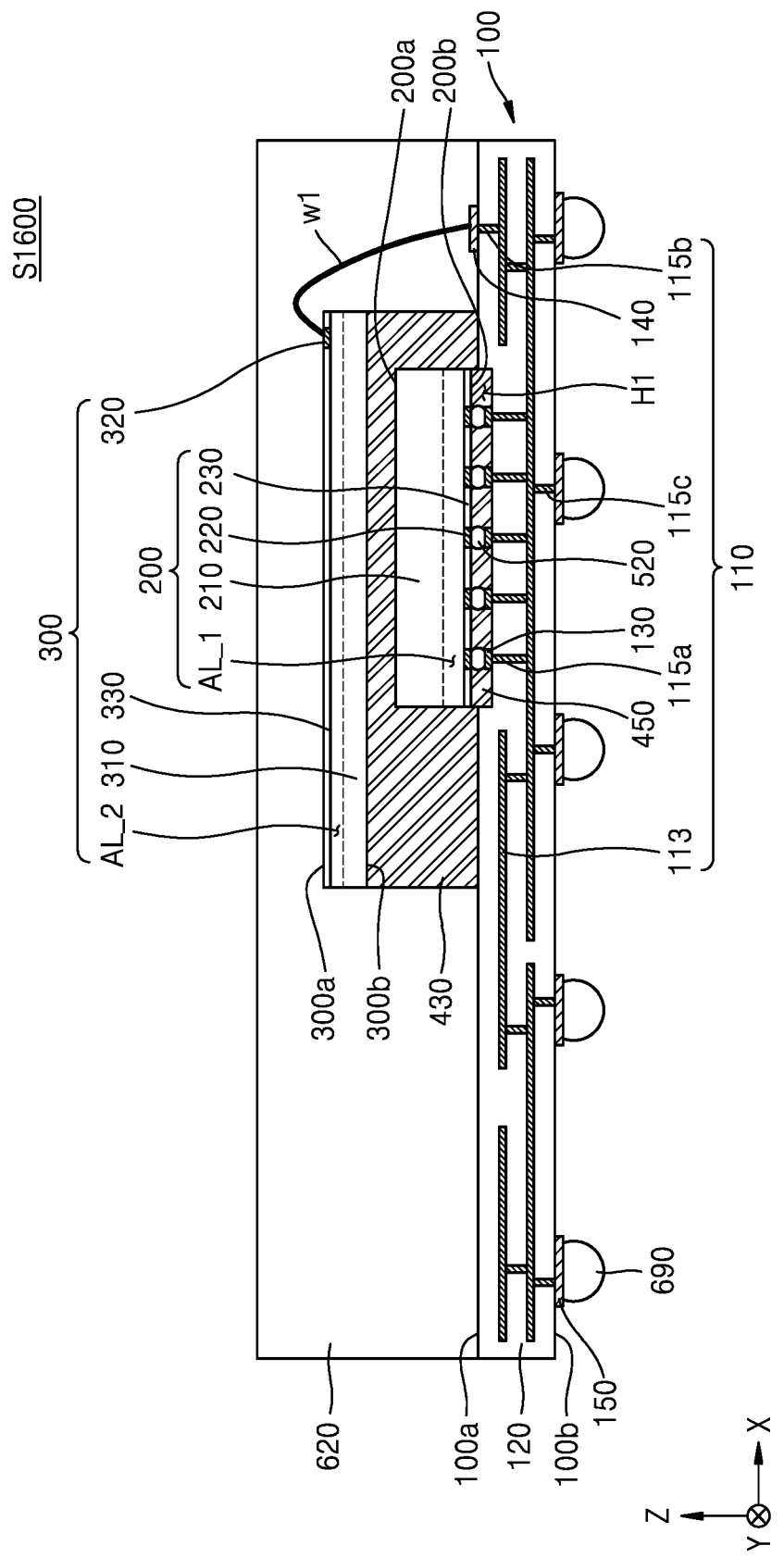

Referring to FIGS. 6 and 13 together, the method S100 of manufacturing the semiconductor package 10 according to the embodiment of the inventive concept may include operation S1600 of forming the external connection terminal 690.

Before performing operation S1600, the support substrate 1010 attached to the package substrate 100 may be removed. In an embodiment, the support substrate 1010 may be separated by laser ablation or by heating.

Operation S1600 may be an operation of attaching the external connection terminal 690 to the external connection pad 150. In an embodiment, operation S1900 may be an operation of attaching a solder ball made of a metal material to the external connection pad 150. For example, the external connection terminal 690 may be melted through a reflow process and attached to the external connection pad 150.

While the inventive concept has been particularly shown and described with reference to embodiments thereof, it will be understood that various changes in form and details may be made therein without departing from the spirit and scope of the following claims.

What is claimed is:
1. A semiconductor package comprising:
a package substrate comprising:
an insulating layer having an upper surface and a lower surface opposite to the upper surface and provided with a recessed first region which is recessed to a first depth from the upper surface toward the lower surface, wherein a bottom surface of the recessed first region is between the upper surface of the insulating layer and the lower surface of the insulating layer,
a redistribution wiring buried in the insulating layer,
a chip connection pad on a bottom surface of the recessed first region and connected to the redistribution wiring, and
a wire connection pad on the upper surface of the insulating layer and connected to the redistribution wiring;
a first semiconductor chip disposed on the bottom surface of the recessed first region of the insulating layer and comprising a first chip pad connected to the chip connection pad of the package substrate, wherein the first semiconductor chip has a first thickness greater the first depth;
a second semiconductor chip on the first semiconductor chip and connected to the wire connection pad of the package substrate through a conductive wire;
a first adhesion layer on the upper surface of the insulating layer and covering side surfaces of the first semiconductor chip;
a chip connection terminal interposed between the chip connection pad and the first chip pad; and a second adhesion layer in the recessed first region of the insulating layer and surrounding the chip connection terminal.

2. The semiconductor package of claim 1,
wherein a side surface of the first semiconductor chip and a side surface of the second adhesion layer are coplanar with each other.

3. The semiconductor package of claim 1, further comprising:
a chip connection terminal interposed between the chip connection pad and the first chip pad; and
a molding layer filled in the recessed first region of the insulating layer,
wherein the molding layer includes a first portion between a lower surface of the first semiconductor chip and the bottom surface of the recessed first region of the insulating layer, and a second portion on the upper surface of the insulating layer and a side surface of the first semiconductor chip, and
wherein the second portion of the molding layer has an increasing cross-sectional area in a vertical direction from the first semiconductor chip toward the insulating layer.

4. The semiconductor package of claim 1,
wherein a thickness of the first adhesion layer is greater than a thickness of the first semiconductor chip, and
wherein when the semiconductor package is viewed in a top down view, the second semiconductor chip is greater than the first semiconductor chip in area.

5. The semiconductor package of claim 4,
wherein a side surface of the first adhesion layer and a side surface of the second semiconductor chip are coplanar with each other.

6. The semiconductor package of claim 1,
wherein a thickness of the first adhesion layer has a value from about 90 micrometers to about 135 micrometers.

7. The semiconductor package of claim 1,
wherein a lower surface of the first semiconductor chip is higher than the upper surface of the insulating layer.

8. The semiconductor package of claim 1,
wherein at least a part of the first semiconductor chip is inserted in the recessed first region of the insulating layer so that a lower surface of the first semiconductor chip is lower than the upper surface of the insulating layer.

9. A semiconductor package comprising:
a package substrate comprising:
an insulating layer having an upper surface and a lower surface opposite to the upper surface, and provided with a recessed first region which is recessed to a first depth from the upper surface of the insulating layer toward the lower surface of the insulating layer,
a redistribution wiring buried in the insulating layer,
a chip connection pad on a bottom surface of the recessed first region and connected to the redistribution wiring, and
a wire connection pad on the upper surface of the insulating layer and connected to the redistribution wiring;
a first semiconductor chip overlapping, in a top-down view of the semiconductor package, the recessed first region of the insulating layer, wherein the first semiconductor chip includes a first semiconductor substrate which has a lower surface and an upper surface opposite to each other, the lower surface of the first semiconductor substrate being closer to the bottom surface of the recessed first region of the package substrate than the upper surface of the first semiconductor substrate, and a first chip pad which is disposed on the lower surface of the first semiconductor substrate and is connected to a first active layer which corresponds to a portion of the first semiconductor substrate, the portion of the first semiconductor substrate being adjacent to the lower surface of the first semiconductor substrate;
a chip connection terminal in the recessed first region of the insulating layer and interposed between the chip connection pad of the package substrate and the first chip pad of the first semiconductor chip;
a first adhesion layer on the package substrate and covering a side surface and an upper surface of the first semiconductor chip;
a second semiconductor chip on the first adhesion layer, wherein the second semiconductor chip includes:
a second semiconductor substrate having a lower surface and an upper surface opposite to each other, the lower surface of the second semiconductor substrate being closer to the upper surface of the first semiconductor substrate and being coplanar with an upper surface of the first adhesion layer, and
a second chip pad disposed on the upper surface of the second semiconductor substrate and connected to a second active layer which corresponds a portion of the second semiconductor substrate, the portion of the second semiconductor substrate being adjacent to the upper surface of the second semiconductor substrate;
a conductive wire connecting the wire connection pad of the package substrate to the second chip pad of the second semiconductor chip; and
a first molding layer on the package substrate and surrounding the first adhesion layer and the second semiconductor chip,
wherein when the semiconductor package is viewed in a top down view, the second semiconductor chip is greater than the first semiconductor chip in area, and
wherein a side surface of the second semiconductor chip and a side surface of the first adhesion layer are coplanar with each other.

10. The semiconductor package of claim 9, further comprising:
a second adhesion layer in the recessed first region of the insulating layer and surrounding the chip connection terminal,
wherein a side surface of the first semiconductor chip and a side surface of the second adhesion layer are coplanar with each other.

11. The semiconductor package of claim 9, further comprising
a second molding layer filled in the recessed first region of the insulating layer,
wherein the second molding layer includes a first portion between a lower surface of the first semiconductor chip and the bottom surface of the recessed first region of the insulating layer, and a second portion which contacts the upper surface of the insulating layer and a side surface of the first semiconductor chip, and
wherein the second portion of the second molding layer has an increasing cross-sectional area in a vertical direction approaching the upper surface of the insulating layer.

12. The semiconductor package of claim 9,
wherein a thickness of the first adhesion layer is greater than a thickness of the first semiconductor chip.

13. The semiconductor package of claim 9,
wherein the first depth of the recessed first region of the package substrate has a value between about 1 micrometer to about 20 micrometers.

14. A semiconductor package comprising:
a package substrate comprising:
an insulating layer having an upper surface and a lower surface opposite to the upper surface and provided with a first region which is recessed to a first depth from the upper surface toward the lower surface,
a redistribution wiring buried in the insulating layer,
a chip connection pad on a bottom surface of the recessed first region and connected to the redistribution wiring, and
a wire connection pad on the upper surface and connected to the redistribution wiring;
a first semiconductor chip overlapping, in a top-down view of the semiconductor package, the recessed first region of the insulating layer, wherein the first semiconductor chip is provided with a first active layer in a lower portion of the first semiconductor chip, and is flip-chip bonded to the chip connection pad of the package substrate;
a first adhesion layer on the package substrate and covering a side surface and an upper surface of the first semiconductor chip;
a second semiconductor chip on the first adhesion layer,
wherein the second semiconductor chip is provided with a second active layer in an upper portion of the second semiconductor chip, and is wire-bonded to the wire connection pad of the package substrate, and
wherein a lower surface of the second semiconductor chip is coplanar with an upper surface of the first adhesion layer;
a third semiconductor chip on the second semiconductor chip, wherein the third semiconductor chip is provided with a third active layer in an upper portion of the third semiconductor chip, and is wire-bonded to the wire connection pad of the package substrate;
a first molding layer on the package substrate, and surrounding the first adhesion layer, the second semiconductor chip, and the third semiconductor chip;
a chip connection terminal interposed between the chip connection pad of the package substrate and the first semiconductor chip; and
a second adhesion layer surrounding the chip connection terminal in the recessed first region of the package substrate,
wherein a side surface of the first semiconductor chip and a side surface of the second adhesion layer are coplanar with each other, and
wherein a part of the side surface of the second adhesion layer is surrounded by the first adhesion layer.

15. The semiconductor package of claim 14,
wherein the first depth of the recessed first region of the package substrate has a value from about 1 micrometer to about 20 micrometers, and
wherein a thickness of the first adhesion layer has a value from about 90 micrometers to about 135 micrometers.

16. The semiconductor package of claim 14, further comprising:
a chip connection terminal interposed between the chip connection pad of the package substrate and the first semiconductor chip; and
a second molding layer filling the recessed first region of the package substrate,
wherein the second molding layer includes a first portion surrounding the chip connection terminal, and a second portion which contacts the upper surface of the insulating layer and a side surface of the first semiconductor chip, wherein the second portion of the second molding layer has an increasing cross-sectional area in a vertical direction approaching the upper surface of the insulating layer,
wherein the second portion of the second molding layer is covered by the first adhesion layer, and
wherein a boundary surface between the first adhesion layer and the second portion of the second molding layer is inclined downward from a side surface of the first semiconductor chip to the upper surface of the insulating layer.

* * * * *